(12) United States Patent
Zhu

(10) Patent No.: US 12,328,918 B2
(45) Date of Patent: Jun. 10, 2025

(54) SEMICONDUCTOR APPARATUS, MANUFACTURING METHOD THEREFOR, AND ELECTRONIC EQUIPMENT INCLUDING THE SEMICONDUCTOR APPARATUS

(71) Applicant: Institute of Microelectronics, Chinese Academy of Sciences, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

(*) Notice: Subject to any disclaimer, the term of this patent is extended or adjusted under 35 U.S.C. 154(b) by 514 days.

(21) Appl. No.: 17/781,227

(22) PCT Filed: Nov. 26, 2020

(86) PCT No.: PCT/CN2020/131737
§ 371 (c)(1),
(2) Date: May 31, 2022

(87) PCT Pub. No.: WO2021/104364
PCT Pub. Date: Jun. 3, 2021

(65) Prior Publication Data
US 2022/0416023 A1    Dec. 29, 2022

(30) Foreign Application Priority Data
Nov. 29, 2019   (CN) .......................... 201911210062.4

(51) Int. Cl.
*H10D 62/10* (2025.01)
*H10D 30/01* (2025.01)
(Continued)

(52) U.S. Cl.
CPC ......... *H10D 62/121* (2025.01); *H10D 30/014* (2025.01); *H10D 30/024* (2025.01);
(Continued)

(58) Field of Classification Search
None
See application file for complete search history.

(56) References Cited

U.S. PATENT DOCUMENTS

| 5,574,294 A | 11/1996 | Shepard |
| 2010/0187503 A1 | 7/2010 | Moriyama et al. |

(Continued)

FOREIGN PATENT DOCUMENTS

| CN | 109300874 A | 2/2019 |
| CN | 110021667 A | 7/2019 |

(Continued)

OTHER PUBLICATIONS

International Search Report issued in Application No. PCT/CN2020/131737, mailed on Mar. 3, 2021 (7 pages).
(Continued)

*Primary Examiner* — Cory W Eskridge
(74) *Attorney, Agent, or Firm* — Osha Bergman Watanabe & Burton LLP

(57) ABSTRACT

Disclosed are a semiconductor apparatus, a manufacturing method therefor, and an electronic equipment comprising the semiconductor apparatus. According to the embodiments, the semiconductor apparatus includes a first device and a second device on a substrate that are opposite each other. The first device and the second device each include a channel portion, source/drain portions on both sides of the channel portion that are connected to the channel portion, and a gate stack overlapping the channel portion. The channel portion includes a first portion extending in a vertical direction relative to the substrate and a second
(Continued)

portion extending from the first portion in a transverse direction relative to the substrate. The second portion of the channel portion of the first device and the second portion of the channel portion of the second device extend toward or away from each other.

42 Claims, 25 Drawing Sheets

(51) Int. Cl.
  *H10D 30/43* (2025.01)
  *H10D 30/62* (2025.01)
  *H10D 30/67* (2025.01)
  *H10D 62/13* (2025.01)
  *H10D 64/01* (2025.01)
  *H10D 84/01* (2025.01)
  *H10D 84/03* (2025.01)

(52) U.S. Cl.
  CPC ......... *H10D 30/43* (2025.01); *H10D 30/6211* (2025.01); *H10D 30/6757* (2025.01); *H10D 62/151* (2025.01); *H10D 64/017* (2025.01); *H10D 64/021* (2025.01); *H10D 84/017* (2025.01); *H10D 84/0184* (2025.01); *H10D 84/038* (2025.01)

(56) References Cited

U.S. PATENT DOCUMENTS

| | | | |
|---|---|---|---|
| 2019/0181228 | A1 | 6/2019 | Hashemi et al. |
| 2019/0198669 | A1* | 6/2019 | Park ................ H10D 62/117 |
| 2020/0287046 | A1* | 9/2020 | Frougier ........... H10D 84/0142 |
| 2020/0321434 | A1* | 10/2020 | Cheng ............... H10D 62/364 |
| 2021/0083127 | A1* | 3/2021 | Xie ................... H10D 62/121 |

FOREIGN PATENT DOCUMENTS

| | | |
|---|---|---|
| CN | 111048588 A | 4/2020 |
| CN | 111106111 A | 5/2020 |
| CN | 111106176 A | 5/2020 |

OTHER PUBLICATIONS

Written Opinion issued in International Application No. PCT/CN2020/131737, mailed on Mar. 3, 2021 (6 pages).

* cited by examiner

SEMICONDUCTOR APPARATUS, MANUFACTURING METHOD THEREFOR, AND ELECTRONIC EQUIPMENT INCLUDING THE SEMICONDUCTOR APPARATUS

CROSS-REFERENCE TO RELATED APPLICATION

This application claims the priority of Chinese Patent Application No. 201911210062.4 filed on Nov. 29, 2019, entitled "Semiconductor apparatus, Manufacturing method therefor, and Electronic equipment Including the Semiconductor apparatus", the contents of which are incorporated herein by reference.

TECHNICAL FIELD

The present disclosure relates to the field of semiconductors, and more particularly, to a semiconductor apparatus having a comb-like channel structure, a manufacturing method therefor, and an electronic equipment including the semiconductor apparatus.

BACKGROUND

Various different structures have been proposed to meet the challenge of further miniaturization of semiconductor apparatus, such as fin field effect transistor (FinFET) and multi-bridge channel field effect transistors (MBCFET). For FinFET, as it is further miniaturized, the height of a fin may become larger and larger to obtain sufficient drive current while saving area. However, if the height of the fin is too large, it will bring many problems, such as fin collapse, gap filling, etch profile control and so on. For MBCFET, the spacing between nanosheets included therein cannot continue to be reduced for gate metal filling purpose, and the self-heating problem becomes severe. Further, unlike FinFET, the height of MBCFET cannot be used to enhance device performance.

SUMMARY

According to an aspect of the present disclosure, a semiconductor apparatus is provided, including a first device and a second device that are opposite to each other on a substrate. The first device and the second device each include a channel portion, source/drain portions on both sides of the channel portion that are connected to the channel portion, and a gate stack overlapping the channel portion. The channel portion includes a first portion extending in a vertical direction relative to the substrate and a second portion extending from the first portion in a transverse direction relative to the substrate. The second portion of the channel portion of the first device and the second portion of the channel portion of the second device extend toward or away from each other.

According to another aspect of the present disclosure, a manufacturing method for a semiconductor apparatus is provided, including: providing a first sacrificial layer for an isolation layer on a substrate; providing at least one second sacrificial layer for a gate stack and at least one alternating stack for first active layer on the first sacrificial layer; patterning the first sacrificial layer and the stack into a ridge structure extending in a first direction on the substrate; forming a second active layer in contact with the first active layer on sidewalls on opposite sides of the ridge structure in a second direction intersecting the first direction; forming a first portion of the isolation layer on a periphery of the ridge structure on the substrate; forming a trench extending in the first direction in the middle of the ridge structure to separate the ridge structure into a first portion and a second portion; removing the first sacrificial layer; forming a second portion of the isolation layer on the substrate; removing the second sacrificial layer; forming the gate stack extending in the second direction on the isolation layer so as to intersect with the first active layer and the second active layer; exposing a portion of the substrate on opposite sides of the gate stack in the first direction by selective etching, wherein the first portion and the second portion of the ridge structure are selectively etched to form the first channel portion and the second portion, respectively; and forming source/drain portions connected to the first active layer and the second active layer of each of the first channel portion and the second channel portion, respectively, on the exposed substrate.

According to another aspect of the present disclosure, an electronic equipment is provided, including the semiconductor apparatus as described above.

BRIEF DESCRIPTION OF THE DRAWINGS

The above and other objects, features and advantages of the present disclosure will become more apparent from the following description of embodiments of the present disclosure with reference to accompanying drawings, in which:

FIGS. 1 to 25(b) show schematic diagrams of some stages in a process of manufacturing a semiconductor apparatus according to some embodiments of the present disclosure;

FIGS. 26(a) to 26(g) show schematic diagrams of an semiconductor apparatus according to other embodiments of the present disclosure, wherein, FIGS. 1 to 10, 11(a) to 11(d), 12 to 14, 15(b), 23(a), 24(a), 25(a), 26(a) to 26(g) are cross-sectional views taken along line AA', FIGS. 15(a), 16, 18(a) are top views, FIGS. 15(d), 17(b), 18(c), 19, 20, 21(b), 23(c), 24(b) are cross-sectional views taken along line CC', and FIGS. 22(b), 23(d), 24(c), 25(b) are cross-sectional views taken along line DD'.

Throughout the drawings, the same or similar reference numbers refer to the same or similar portions.

DETAILED DESCRIPTION OF EMBODIMENTS

Figure 1:
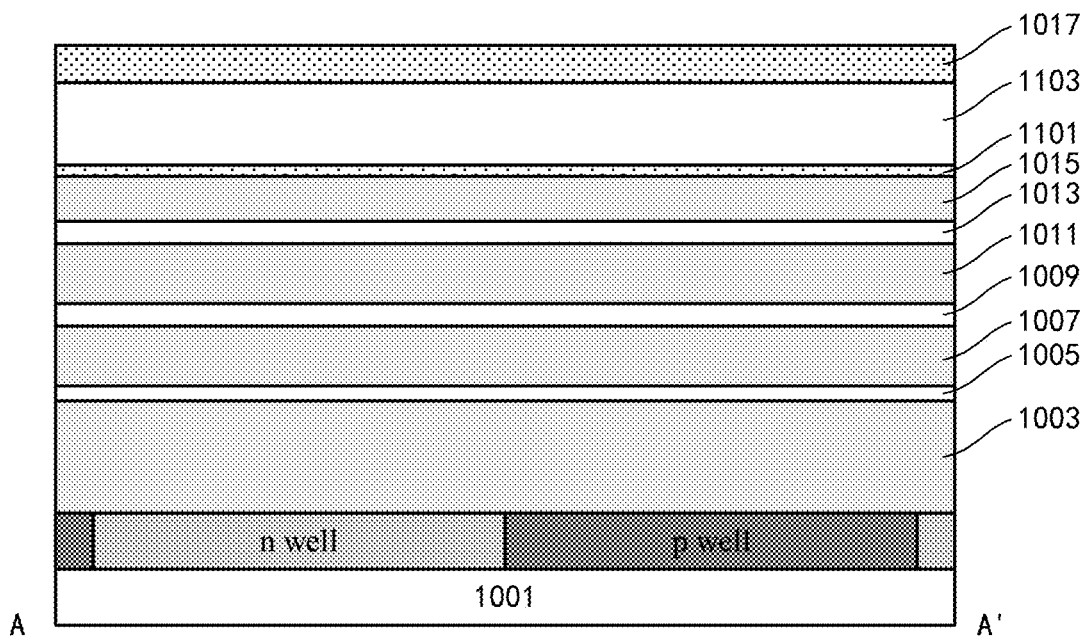

Embodiments of the present disclosure will be described below with reference to accompanying drawings. It should be understood, however, that these descriptions are merely exemplary, and are not intended to limit the scope of the present disclosure. Further, in the following description, descriptions of well-known structures and techniques are omitted to avoid unnecessarily obscuring concepts of the present disclosure.

Various structural schematic diagrams according to the embodiments of the present disclosure are shown in the accompanying drawings. The drawings are not to scale, some details have been exaggerated for clarity, and some details may be omitted. Shapes of various regions and layers shown in the drawings, as well as their relative sizes and positional relationships are only exemplary, and may vary in practice due to manufacturing tolerances or technical limitations, and regions/layers having different shapes, sizes and relative positions may be additionally designed by those skilled in the art as desired.

In the context of the present disclosure, when a layer/element is referred to as being "on" another layer/element, it may be directly on the another layer/element or there may be intervening layers/elements. In addition, if a layer/element is "on" another layer/element in one orientation, the layer/element may be "below" the another layer/element when the orientation is reversed.

According to some embodiments of the present disclosure, a semiconductor apparatus having a comb-like channel structure is proposed. For example, the channel portion of the semiconductor apparatus may include a first portion extending in a vertical direction relative to the substrate (for example, a direction substantially perpendicular to a surface of the substrate) and a second portion extending from the first portion in a lateral direction relative to the substrate (for example, a direction substantially parallel to the surface of the substrate). The second portion may be spaced apart from the substrate. There may be a plurality of such second portions, and the second portions are spaced apart from one another in the vertical direction. The second portion(s) may extend from the first portion towards a (same) side of the first portion, for example, in the lateral direction relative to the substrate. Thus, the channel portion may have a comb-like shape as a whole. The top surface of the first portion may be higher than the top surface of the uppermost second portion. The first portion of the channel portion may be similar to a fin in a fin field effect transistor (FinFET), and the second portion of the channel portion may be similar to a nanosheet in a nanosheet field effect transistor (FET) or a multi-bridge channel field effect transistor (MBCFET).

Accordingly, the semiconductor apparatus according to embodiments of the present disclosure may have advantages of both FinFET and nanosheet FET or MBCFET. In the semiconductor apparatus, a current driving capability may be simultaneously provided by the first portion and the second portion of the channel portion, so that the device performance may be improved and the area may be saved. Also, due to a mutual coupling of the first portion and the second portion, the mechanical stability during the manufacturing stage is better, for example, better than conventional MBCFET.

The semiconductor apparatus may further include source/drain portions on opposite sides of the channel portion, the source/drain portions being connected to the channel portion to constitute an active region of the semiconductor apparatus. A longitudinal direction of the active region may extend in the first direction. The source/drain portions may include the same material as the channel portion, or may include a different material to, for example, apply stress to the channel portion so as to enhance device performance. The source/drain portions may be grown from underlying substrate and/or sidewalls of the channel portion. The top surface of the source/drain portions may be higher than the top surface of the channel portion.

The first portion and/or the second portion of the channel portion may include a single crystal semiconductor material to improve device performance. For example, the first portion and/or the second portion of the channel portion may be formed by epitaxial growth, so that their thicknesses may be better controlled. Of course, the source/drain portions may also include a single crystal semiconductor material. Crystal interfaces may exist between at least some of the separately grown semiconductor layers. For example, the crystal interface is observable at at least one of: between the first portion of the channel portion and the source/drain portions, between the second portion of the channel portion and the source/drain portions, and between the first portion and the second portion of the channel portion.

The semiconductor apparatus may further include a gate stack overlapping the channel portion. The gate stack may extend in a second direction intersecting (for example, perpendicular to) the first direction, from one side of the channel portion across the channel portion to the other side thereof. The gate stack may enter voids between respective second portions of the channel portion (where there are a plurality of second portions) and voids between the lowermost second portion and the substrate. Thus, the gate stack may be in contact with opposing sidewalls and top surfaces of the first portion of the channel portion, upper and lower surfaces of the second portion(s), and sidewalls of the second portion(s) on a side remote from the first portion, and define a channel region therein.

A spacer may be formed on sidewalls of the gate stack on opposite sides in the first direction. The gate stack may be separated from the source/drain portions by the spacer. The sidewalls of the spacer facing the source/drain portions tray be substantially coplanar in the vertical direction. The spacer may include a first portion extending on both sides of the channel portion and over an uppermost second portion of the channel portion, and a second portion extending between the second portions of the channel portion (where there are a plurality of second portions) and between the lowermost second portion of the channel portion and the substrate. The first and second portions of the spacer may comprise different materials. The first and second portions of the spacer may have substantially the same thickness.

According to some embodiments of the present disclosure, the above-described semiconductor apparatus may be provided in pairs. The second portion of the respective channel portions of a pair of adjacent semiconductor apparatus may extend toward or away from each other. As described below, the second portions of the respective channel portions of the semiconductor apparatus that are opposite to each other may be obtained by the same active layer, so they may be substantially coplanar, for example, the upper and lower surfaces thereof are coplanar, respectively. In addition, the first portions in the respective channel portions of the semiconductor apparatus may be formed by the same process, and thus they may have substantially the same characteristics, such as thickness, height, and the like.

An isolation layer may be provided on the substrate. The isolation layer may include a first portion surrounding the active region and a second portion extending between the channel portion and the substrate. A gate stack may be formed on the isolation layer. As described below, the second portion of the isolation layer may be formed under the channel portion in a self-aligned manner to the gate stack. In the first direction, the second portion of the isolation layer may be interposed between the source/drain portions.

Under the first portion of the channel portion, a punch-through stopper (PTS) may be provided to suppress or even prevent current leakage between the source/drain portions when passing through a region under the first portion. The PTS may be a semiconductor layer in contact with the substrate and may be appropriately doped. This semiconductor layer in contact with the substrate truly improve the heat dissipation of the device.

Such a semiconductor apparatus may be manufactured, for example, as follows.

First, a comb-like channel portion may be provided on the substrate.

For example, a first sacrificial layer may be formed on the substrate, and the first sacrificial layer may define a location of the second portion of the isolation layer. Alternating stacks including at least one second sacrificial layer and at least one first active layer may be formed on the first sacrificial layer. These layers may be formed by epitaxial growth. The first active layer may be used to form the second portion of the channel portion, and the second sacrificial layer may be used to define the voids (in which the gate stack may be subsequently formed) between the second portion and the first isolation portion and between the second portions (where there are a plurality of the second portions). The uppermost layer of the stack may be a second sacrificial layer to form a solid contact between the subsequently formed second active layer and the first active layers, especially the uppermost first active layer. The first sacrificial layer and the stack may be patterned into a ridge structure extending in the first direction. In this way, the first active layer in the stack may be formed as a nanosheet.

A second active layer connected to the first active layer may be formed on sidewalls of the ridge structure, for example, on both sidewalls in a second direction intersecting (for example, perpendicular to) the first direction. The second active layer may extend vertically on the sidewalls of the ridge structure to form fins. For example, the second active layer may be formed by epitaxially growing a semiconductor layer from the surface of the substrate and the surface of the ridge structure. A first portion of an isolation layer may be formed on the periphery of the ridge structure on the substrate (with the second active layer formed on the sidewall) for subsequent formation of the gate stack thereon.

A trench extending in the first direction may be formed in the middle of the ridge structure to bisect the ridge structure for respectively defining active stacks of two devices. The trench may expose the first sacrificial layer. The first sacrificial layer may be removed, leaving a void below the channel portion. In the void, a second portion of the isolation layer may be formed. When forming the second portion of the isolation layer, the gate stack may be used as a mask for patterning, so that the second portion of the isolation layer may be self-aligned to the gate stack.

The second sacrificial layer may be removed. In this way, the first active layer and the second active layer in each active stack obtained from the ridge structure form a comb-like structure. The fabrication of semiconductor apparatus continues on the basis of the comb-like structure that truly be obtained.

As described above, the comb-like structure is used for the channel portion. The definition of the channel portion and the formation of the gate stack may be performed in combination. For example, a gate stack extending in the second direction so as to overlapping the first active layer and the second active layer may be formed on the substrate, particularly on the isolation layer. The comb-like structure may be patterned by using the gate stack as a mask, so that it remains under the gate stack to form a channel portion, and the exposed portions on both sides of the gate stack may be removed.

On both sides of the gate stack on the substrate in the first direction, source/drain portions in contact with the first active layer and the second active layer may be formed by, for example, epitaxial growth.

The gate stack formed above may be a sacrificial gate stack. The sacrificial gate stack may be replaced by a real gate stack through a replacement gate process.

The present disclosure may be presented in various forms, some examples of which are described below. In the following description, the selection of various materials is involved. The selection of materials takes into account etch selectivity in addition to their function (for example, semiconductor material for forming active regions, dielectric material for forming electrical isolation). In the following description, the desired etch selectivity may or may not be indicated. It should be clear to those skilled in the art that when it is mentioned below that a certain material layer is etched, if it is not mentioned that other layers are also etched or the drawing does not show that other layers are also etched, then such etching may be selective, and the material layer may have etch selectivity relative to other layers exposed to the same etch recipe.

FIG. 1 to FIG. 25(b) show schematic diagrams of some stages in the process of manufacturing a vertical semiconductor apparatus according to some embodiments of the present disclosure.

As shown in FIG. 1, a substrate 1001 is provided. The substrate 1001 may be various forms of substrates, including but not limited to bulk semiconductor material substrates such as bulk Si substrates, semiconductor-on-insulator (SOI) substrates, compound semiconductor substrates such as SiGe substrates, and the like. Hereinafter, for the convenience of description, a bulk Si substrate is used as an example for description.

A well region may be formed in the substrate 1001. If a p-type device is to be formed, the well region tray be an n-type well; if an n-type device is to be formed, the well region may be a p-type well. The well region may be formed, for example, by implanting a dopant of corresponding conductivity type (a p-type dopant such as B or In, or an n-type dopant such as As or P) into the substrate 1001 and subsequent thermal annealing. There are many ways in the art to provide such a well region, which will not be repeated here.

In this example, a description is given of an example where both a p-type device and an n-type device are formed, and the p-type device and the n-type device are adjacent to each other (a complementary metal-oxide-semiconductor (CMOS) configuration may then be formed), thus forming a n-type well and a p-type well that are contiguous with each other. In the illustrated example, the p-type well and the n-type well are alternately arranged. However, the present disclosure is not limited thereto. For example, devices of a single conductivity type may be formed, or devices of different conductivity types may not be contiguous with each other, but formed separately in separate regions.

On the substrate 1001, a first sacrificial layer 1003 may be formed by, for example, epitaxial growth. The first sacrificial layer 1003 may then be used to define the first spacer, for example, with a thickness of about 10-30 nm. In addition, for better etching control, a first etch stop layer 1005 may be formed on the first sacrificial layer 1003 by, for example, epitaxial growth. The first etch stop layer 1005 may be thin, for example, about 2-5 nm thick. On the first etch stop layer 1005, a stack including alternating second sacrificial layers 1007, 1011, 1015 and first active layers 1009, 1013 may be formed, for example, by epitaxial growth. The first active layers 1009, 1013 may then form nanosheets of a channel portion with a thickness of, for example, about 5-15 nm. When the first active layers 1009, 1013 are formed, in-situ doping may be performed to adjust the device threshold. The second sacrificial layers 1007 and 1011 may define gaps between the nanosheets, for example, with a thickness of about 10-25 nm. The uppermost second sacrificial layer 1015 may be slightly thinner, for example, about 10-20 nm thick. The number of the second sacrificial layers and the first active layers in the stack may vary depending on the device design, for example, may be enlarged or reduced.

Adjacent layers of the substrate 1001 and the above-mentioned layers formed thereon may have etching selectivity with respect to one another. For example, the first sacrificial layer 1003 and the second sacrificial layers 1007, 1011, 1015 may include SiGe (for example, about 10%-30% Ge by atomic percent), and the first etch stop layer 1005 and the first active layers 1009, 1013 may include Si.

According to the embodiments, the spacer pattern transfer technique is used in the following patterning process. To form the spacer, a mandrel may be formed. Specifically, a layer 1103 for the mandrel pattern may be formed on the above-described stack, for example, by deposition. For example, the layer 1103 for the mandrel pattern may include amorphous silicon, polysilicon or other materials such as SiC, with a thickness of about 50-200 nm. In addition, for better etching control, a second etch stop layer 1101 may be formed first, for example, by deposition. For example, the second etch stop layer 1101 may include oxide (for example, silicon oxide) with a thickness of about 2-10 nm.

On the layer 1103 for the mandrel pattern, a hard mask layer 1017 may be formed, for example, by deposition. For example, the hard mask layer 1017 may include nitride (for example, silicon nitride) with a thickness of about 20-100 nm.

Figure 2:
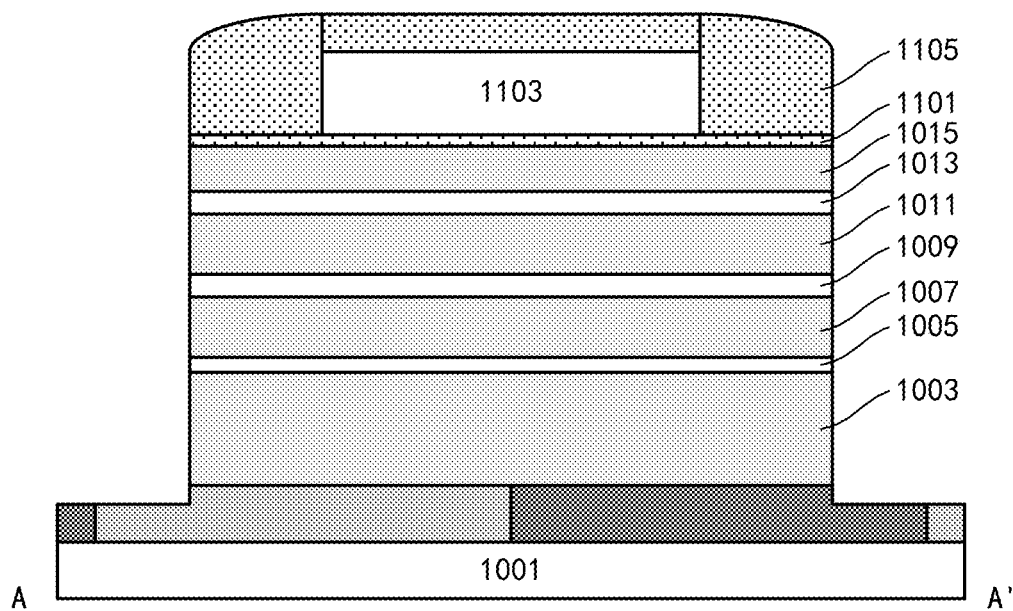

As shown in FIG. 2, the layer 1103 for the mandrel pattern may be patterned into a mandrel pattern. For example, a photoresist (not shown) may be formed on the hard mask layer 1017 and patterned into strips extending in a first direction (the direction entering the paper in the drawing) by photolithography. Then, by using the photoresist as an etch mask, the hard mask layer 1017 and the layer 1103 for the pattern of the mandrel are sequentially selectively etched, for example, by reactive ion etching (RIE) to transfer the pattern of the photoresist into the hard mask layer 1017 and layer 1103 for the mandrel pattern. The etching may be stopped at the second etch stop layer 1101. Afterwards, the photoresist may be removed. Spacers 1105 may be formed on opposite sides of the mandrel pattern 1103 in a second direction (the horizontal direction in the drawing) intersecting (for example, vertical) with the first direction. For example, a layer of nitride may be deposited in a substantially conformal manner, and then the deposited nitride layer may be anisotropically etched in a vertical direction (may stop at the second etch stop layer 1101) to remove a laterally-extending portion thereof while leaving a vertically-extending portion thereof, so as to obtain the spacers 1105.

The spacers 1105 may then define nanosheets in a channel portion. Therefore, a size of the spacer 1105 may be determined according to a size of the nanosheet in the semiconductor apparatus to be formed. For example, a width of the spacer 1105 (a dimension in the horizontal direction in the drawing) is about 20-150 nm. Additionally, the spacers 1105 may be located on the n-well and p-type, respectively, to define nanosheets in respective channel portions of the p-type and n-type devices that are subsequently formed, respectively.

The first sacrificial layer 1003 and the above-mentioned stacked layers thereon may be patterned into a ridge structure by using the hard mask layer 1017 and the spacers 1105, to define an active region. For example, the hard mask layer 1017 and the spacers 1105 may be used as an etch mask, and each layer may be selectively etched in sequence by, for example, RIE, to transfer the pattern into underlying layers. The well region of the substrate 1001 may be etched. Thus, the stack including the first sacrificial layer 1003, the first etch stop layer 1005, the second sacrificial layers 1007, 1011, 1015 and the first active layers 1009, 1013 may form a ridge structure extending in the first direction.

Figure 3:
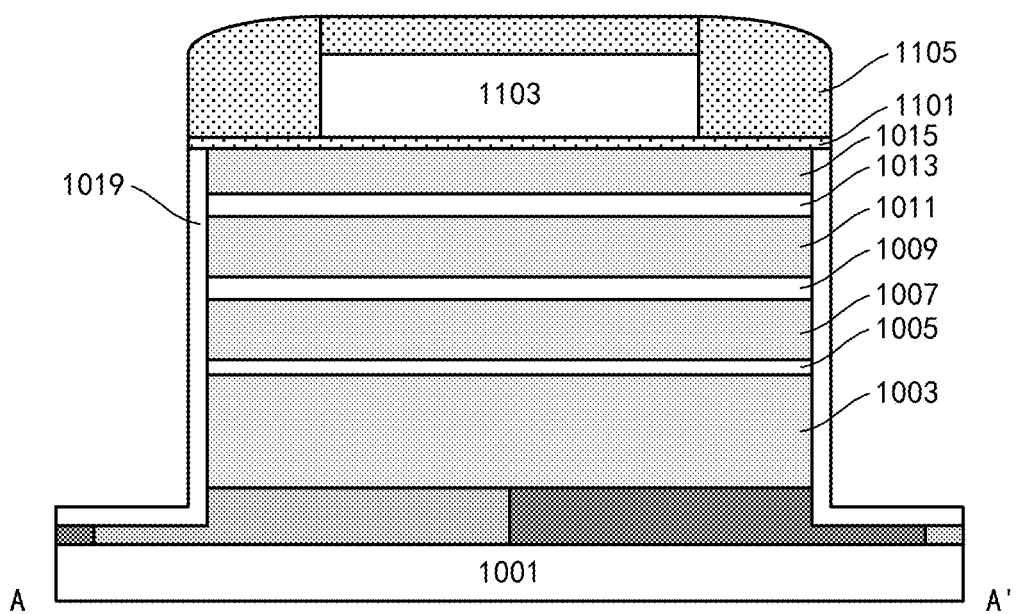

A second active layer may be formed on a sidewall of the ridge structure to subsequently define fin of the channel portion. For the convenience of the following patterning, a portion of the second active layer serving as a fin may be formed under the spacers 1105 (the protective layer for the fin may be minimized in the following patterning). As shown in FIG. 3, the ridge structure may be etched back so that its peripheral sidewall is laterally concave relative to a peripheral sidewall of the spacers 1105. Due to such an etch back, a portion of the substrate may also be etched away. Then, the second active layer 1019 may be formed on the sidewall of the ridge structure by, for example, selective epitaxial growth. Due to the selective epitaxial growth, the second active layer 1019 may be formed on vertical sidewalls of the ridge structure and a surface of the substrate 1001. The second active layer 1019 may then define the fin of the channel portion with a thickness of, for example, about 5-15 nm. Unlike the conventional FinFET in which the thickness of the fin is usually determined by the etching process, the thickness of the second active layer 1019 (subsequently used as a fin) according to embodiments of the present disclosure may be determined by the epitaxial growth process, thus the thickness of the fin may be better controlled.

As shown in FIG. 3, sidewalls of a portion of the second active layer 1019 on the vertical sidewalls of the ridge structure are shown to be aligned with the sidewalls of the spacers 1105. This may be achieved by controlling the amount of the etch back and the epitaxial growth thickness to be substantially the same. However, the present disclosure is not limited thereto. For example, the sidewalls of the portion of the second active layer 1019 on the vertical sidewalls of the ridge structure may be recessed or may even protrude relative to the sidewalls of the spacers 1105.

In this example, the first active layer and the second active layer may include the same material (Si). However, the present disclosure is not limited thereto. The first active layer and the second active layer may have different thicknesses with considering the mechanical stability of the structure, so that the threshold voltages of the first and second portions of the channel portion may be different from each other or mismatch with each other. In addition, a T-type structure formed by the first portion and the second portion may also affect the electric field distribution and thus affect the threshold voltage. As a result, for example, the first active layer and the second active layer may include different semiconductor materials, so that the respective threshold voltages of the first and second portions of the channel portion corresponding to the first active layer and the second active layer may be adjusted to match with each other. Additionally or alternatively, the first active layer and the second active layer may include different doping concentrations and/or doping impurities (for example, impurities of different conductivity types) in order to adjust the respective threshold voltages of the first and second portions of the channel portion corresponding to the first active layer and the second active layer.

Figure 4:
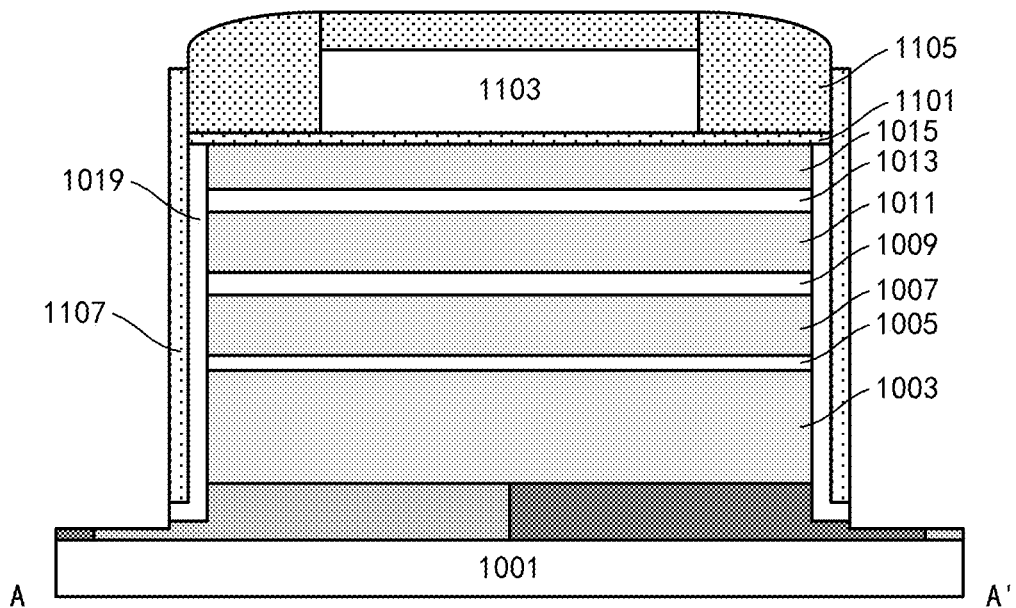

The second active layer 1019 extends across the well regions on the surface of the substrate 1001. For the purpose of device isolation, the second active layer 1019 may be separated in device regions (or well regions). To protect the portion of the second active layer 1019 serving as the fin, a protective layer 1107 may be formed on the sidewall of the second active layer 1019, as shown in FIG. 4. The protective layer 1107 may be a spacer such as an oxide formed through a spacer forming process. The second active layer 1019 may be selectively etched, such as RIE, by using the hard mask layer 1017 and the spacer 1105 (and the protective layer 1017) as an etching mask. Etching may proceed into the well regions of the substrate 1001 to completely cut off the second active layer 1019 between the well regions.

According to another embodiment of the present disclosure, the formed protective layer 1107 may contain dopant impurities in order to subsequently form a punch-through stopper (PTS). In this example, since both the p-type device and the n-type device are formed, the protective layer 1107 may contain doping impurities of different conductivity types for devices of different conductivity types. For example, the protective layer 1107 on the left sidewall of the ridge structure is formed on the n-type well for the p-type device, and may contain n-type impurities such as P or As, for example, at a concentration of about 0.05%-3%; and the protective layer 1107 on the right sidewall of the ridge structure is formed on the p-type well for the n-type device, and may contain p-type impurities such as B, for example, at a concentration of about 0.05%-3%, The protective layer 1107 containing impurities of different conductivity types may be formed separately. For example, one kind of spacer may be formed on both sidewalls of the ridge structure first, and then the spacer on one side may be removed by photolithography, and then another type of spacer may be formed.

Figure 5:
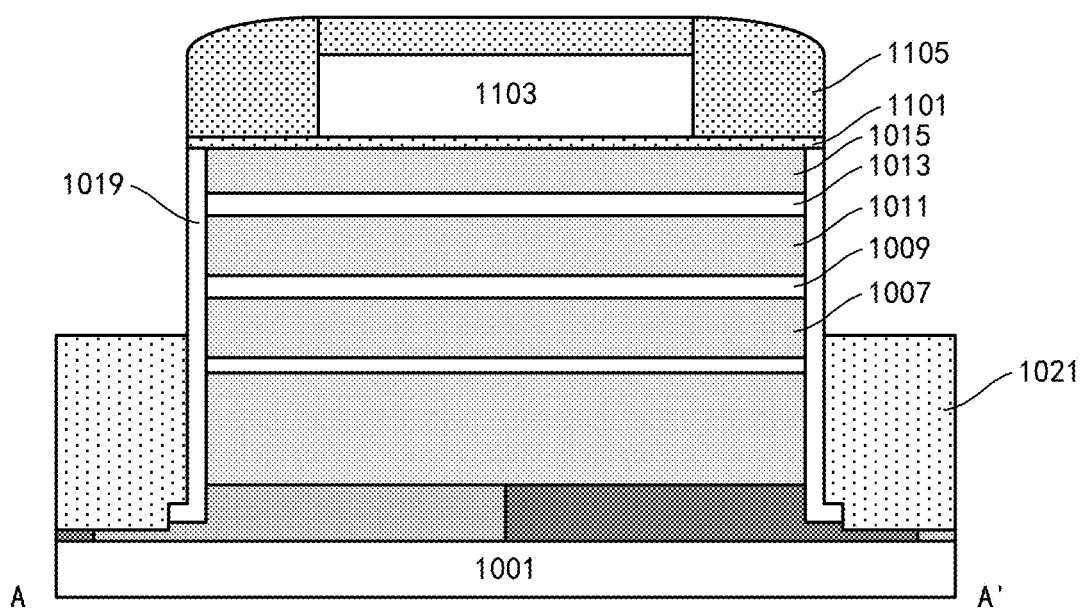

As shown in FIG. 5, an isolation layer 1021 (a first portion of the isolation layer) may be formed around the active region. The isolation layer 1021 may be a shallow trench isolation (STI) defining the active region. For example, an oxide layer completely covering the ridge structure may be formed on the substrate 1001 by deposition and then be etched back, to form the isolation layer 1021. The deposited oxide layer may be planarized, such as by chemical mechanical polishing (CMP), before it is etched back, and the CMP may be stopped at the hard mask layer 1017. After it is etched back, a top surface of the isolation layer 1021 may be lower than a bottom surface of the lowermost first active layer 1009 and higher than a top surface of the first sacrificial layer 1003, for example, located between a top surface and a bottom surface of the lowermost second sacrificial layer 1007. As the isolation layer 1021 is etched back, an upper portion of the protective layer 1107, which has the same oxide as the isolation layer 1021, may also be etched away. The remaining portion of the protective layer 1107 is shown integrally with the isolation layer 1021 here.

Figure 6:
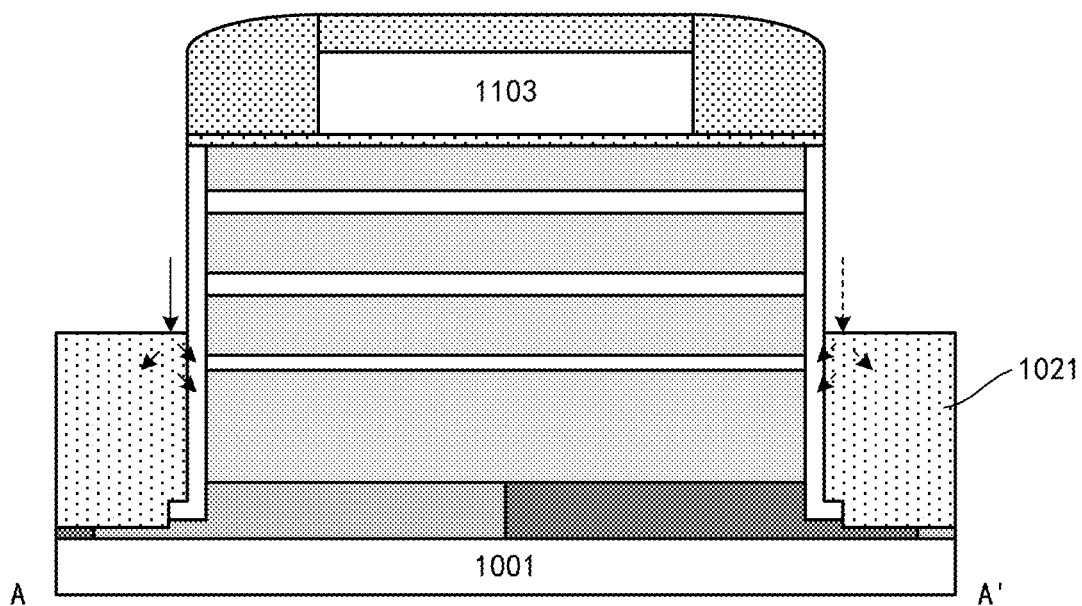
Figure 7:
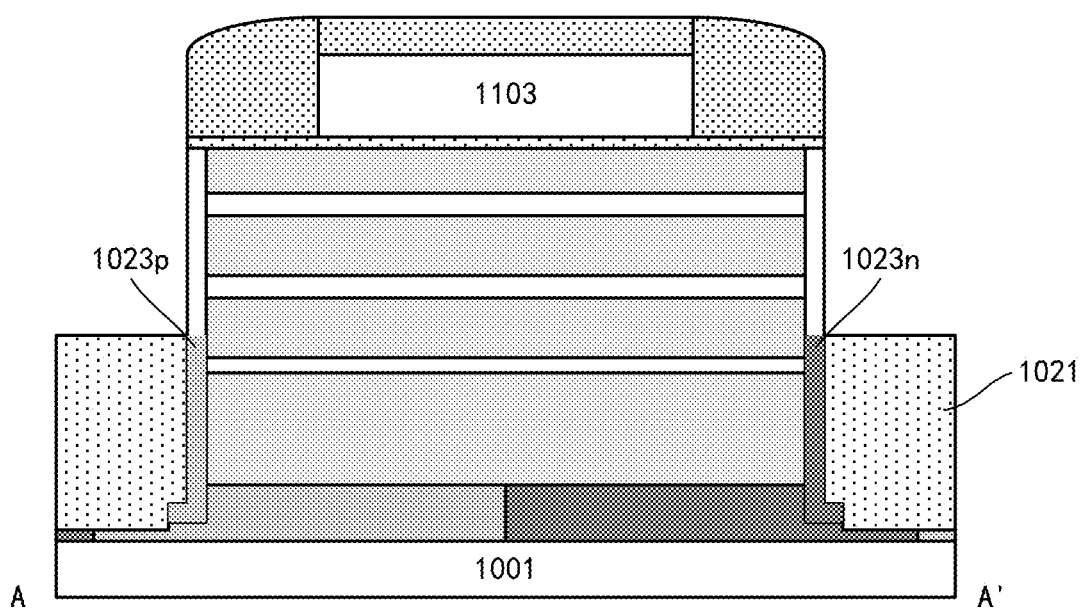

In addition, in order to suppress leakage current, a PTS may be formed in the second active layer 1019, particularly, a portion thereof located below the top surface of the isolation layer 1021 (i.e., a portion of the second active layer 1019 below a portion serving as a channel). The PTS may be formed by means of the isolation layer 1021. As shown in FIG. 6, ion implantation may be performed toward the isolation layer 1021. The ions implanted into the isolation layer 1021 may be scattered into a portion of the second active layer 1019 adjacent to the isolation layer 1021. The implanted ions may have a conductivity type opposite to that of the device to be formed. For example, for the n-type device, p-type dopants such as B or In may be implanted; for the p-type device, n-type dopants such as As or P may be implanted. The injected dose may be about 1E17-1E19 $cm^{-3}$. Annealing may be performed at a temperature of about 750-1050° C. to activate the implanted dopants to form the PTS 1023p for the p-type device and the PTS 1023n for the n-type device.

According to another embodiment of the present disclosure, as described above, the formed protective layer 1107 may contain doping impurities. With forming the isolation layer 1021, the upper portion of the protective layer 1107 is removed, and the remaining portion thereof is embedded into the isolation layer 1021, and the top surface is substantially flush with the top surface of the isolation layer 1021. In this case, instead of ion implantation, the PTS may be formed by, for example, annealing at a temperature of about 750-1050° C. to drive impurities in the protective layer 1107 into the second active layer 1019.

Figure 8:
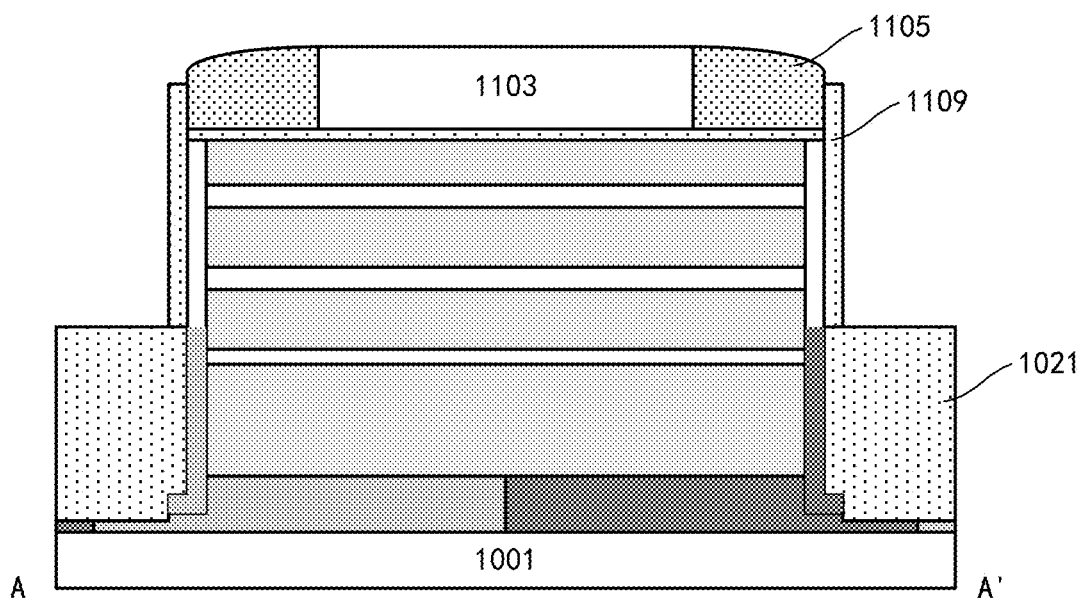

In the above process of forming the isolation layer 1021, the upper portion of the protective layer 1107 is removed, so that the sidewall of the second active layer 1019 is exposed. In order to protect the active layer 1019 during subsequent processes, especially during patterning the active region, a protective layer 1109 may be further formed on the isolation layer 1021, as shown in FIG. 8. Similarly, for example, the protective layer 1109 may be formed as an oxide in the form of a spacer.

Currently, the respective active regions of adjacent p-type and n-type devices are still connected together, and they may be separated from each other. As mentioned above, the spacer pattern transfer technique may be used in separating active regions of adjacent devices.

Figure 9:
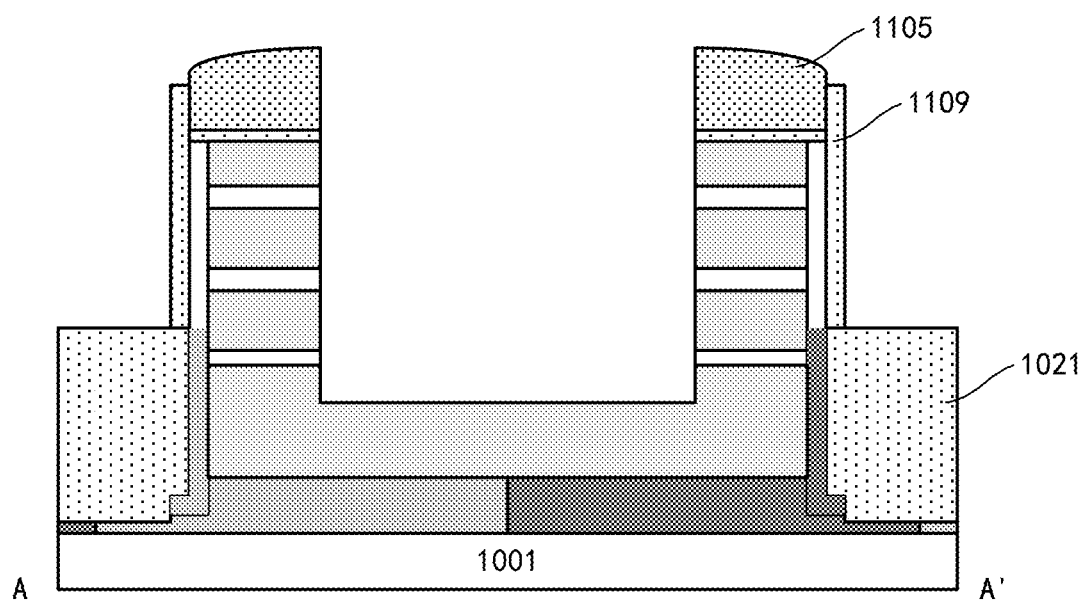

As shown in FIG. 8, the hard mask layer 1017 may be removed by selective etching such as RIE to expose the mandrel pattern 1103. Due to the removal of the hard mask layer 1017, the height of the spacer 1105, which is also nitride in this example, may be reduced. Then the mandrel pattern 1103 may be removed by selective etching such as RIE. In this way, two opposing spacers 1105 are left on the ridge structure. The respective active regions of the p-type device and the n-type device may be respectively defined by the two spacers 1105. As shown in FIG. 9, the two spacers 1105 may be used as masks to selectively etch each layer in the ridge structure by, for example, RIE, and trenches are formed in the ridge structure to separate the respective active regions of the p-type device and the n-type device. As shown in FIG. 9, the ridge structure is separated into two active stacks defined by the two spacers 1105, respectively. Here, etching may proceed into the first sacrificial layer 1003 so that the protective layer (see 1033 shown in FIG. 10) formed later may completely cover sidewalls of the active stacks.

Figure 10:
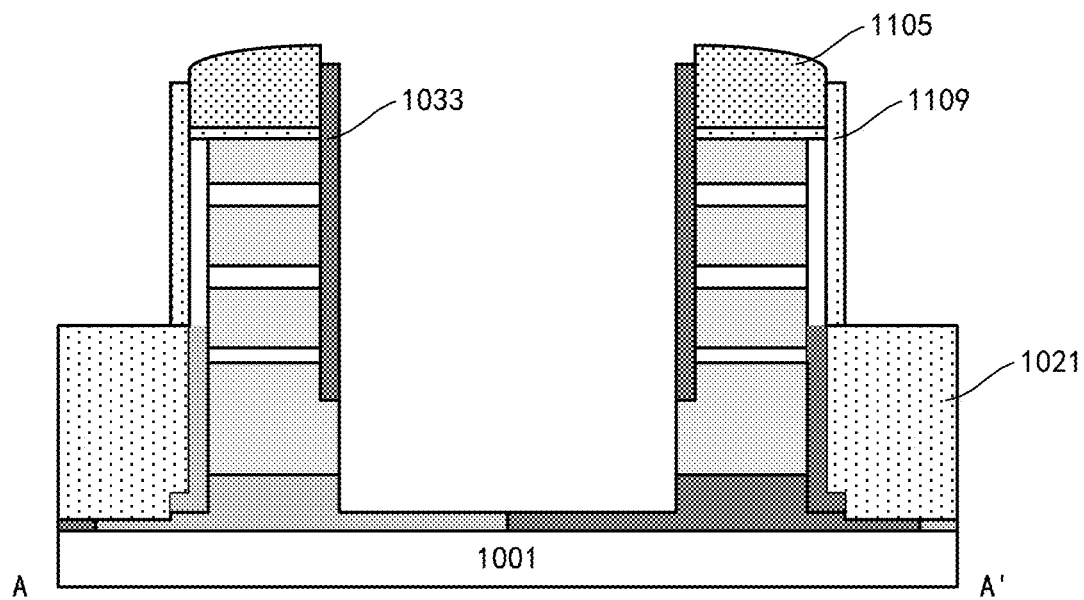

The sidewall of each of the first active layers in the active stacks is currently exposed. To protect the first active layers in the active stacks (especially during the following process of etching the first etch stop layer 1005), as shown in FIG. 10, a protective layer 1033 may be formed on the sidewalls of the active stacks. For example, the protective layer 1033 may include SiC. The protective layer 1033 may be formed through a spacer process, and thus may exist on each vertical sidewall. It should be noted here that such a protective layer 1033 may be omitted if the first active layer may be substantially unetched (i.e., has etch selectivity) by the following etch recipe to which it is exposed.

The above-mentioned trenches in the ridge structure may be further extended into the well regions of the substrate 1001 by selective etching such as RIE to facilitate isolation between p-type and n-type devices.

In this example, the trench is etched in two steps: it is first etched into the first sacrificial layer 1003 (then forming the protective layer 1033), and then etched into the well regions of the substrate 1001. In this way, the formed protective layer 1033 may sufficiently cover the sidewalls of the active stacks on the one hand, and on the other hand may expose the first sacrificial layer 1003 for subsequent removal. Of course, the trench may be directly etched into the well regions of the substrate 1001 without forming the protective layer 1003.

Of course, the formation of the trenches is not limited to the spacer pattern transfer technique, and may also be performed by photolithography using photoresist or the like.

As shown in FIG. 11(*a*), the first sacrificial layer 1003 may be selectively etched with respect to the first etch stop layer 1005 and the substrate 1001 formed of Si (as well as the isolation layer 1021 and protective layer 1109 formed of oxide), so that the first sacrificial layer 1003 may be removed. In this way, voids, in which the surface of the substrate 1001 is exposed, are formed between the active stacks and below the active stacks.

In this embodiment, the first etch stop layer 1005 may help define a location of a lower surface of the subsequently formed gate stack. However, the present disclosure is not limited thereto. If the first sacrificial layer 1003 includes a material having etch selectivity with respect to the second sacrificial layers 1007, 1011, 1015, the first etch stop layer 1005 may be omitted.

According to another embodiment of the present disclosure, in the case where the first etch stop layer 1005 is formed, the first etch stop layer 1005 may be removed by selective etching in order to reduce a capacitance between a gate conductor formed later and the substrate As shown in FIG. 11(*b*), after removing the first sacrificial layer 1003, the first etch stop layer 1005 formed of Si may be further selectively etched with respect to the second sacrificial layer formed of SiGe (as well as the isolation layer 1021 and the protective layer 1109 formed of oxide and the protective layer 1033 formed of SW), so that the first etch stop layer 1005 is removed. In this example, since the first etch stop layer 1005, the second active layer 1009 and the substrate 1001 all contain Si, when the first etch stop layer 1005 is selectively etched, the second active layer 1009 and substrate 1001 may also be etched. In the example of FIG. 11(*b*), an exposed lower portion of the second active layer 1019 may be left with a certain thickness. Unlike this, as shown in FIG. 11(*c*), the exposed lower portion of the second active layer 1019 may be completely removed. In this case, the formation process of the above-mentioned PTS may be omitted, as shown in FIG. 11(*d*). After that, the protective layer 1033 may be removed.

Hereinafter, the case shown in FIG. 11(*a*) will be mainly described as an example.

Figure 12:
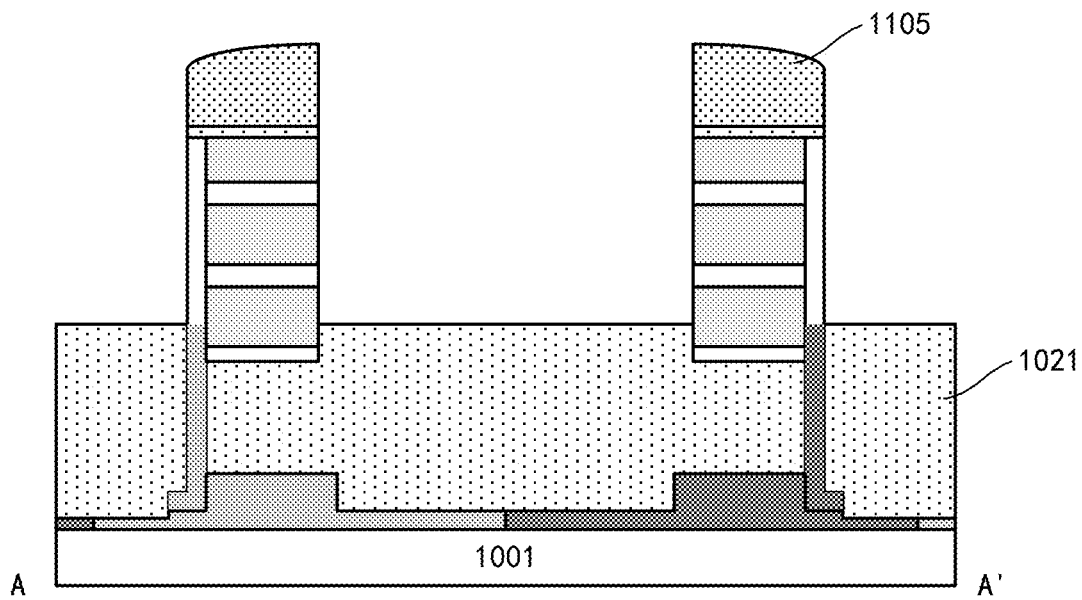

As shown in FIG. 12, in the above-mentioned voids, an isolation layer (a second portion of the isolation layer) may be formed, which is shown here integrally with (the first portion of) the previously formed isolation layer as 1021. A dielectric material such as an oxide is deposited and then etched back to form the second portion of the isolation layer. Before it is etched back, the deposited dielectric material may be subjected to a planarization process such as CMP, which may be stopped at the spacers 1105. A top surface of the dielectric material after it is etched back may be approximately flush with the top surface of (the first portion of) the previously formed isolation layer.

Figure 13:
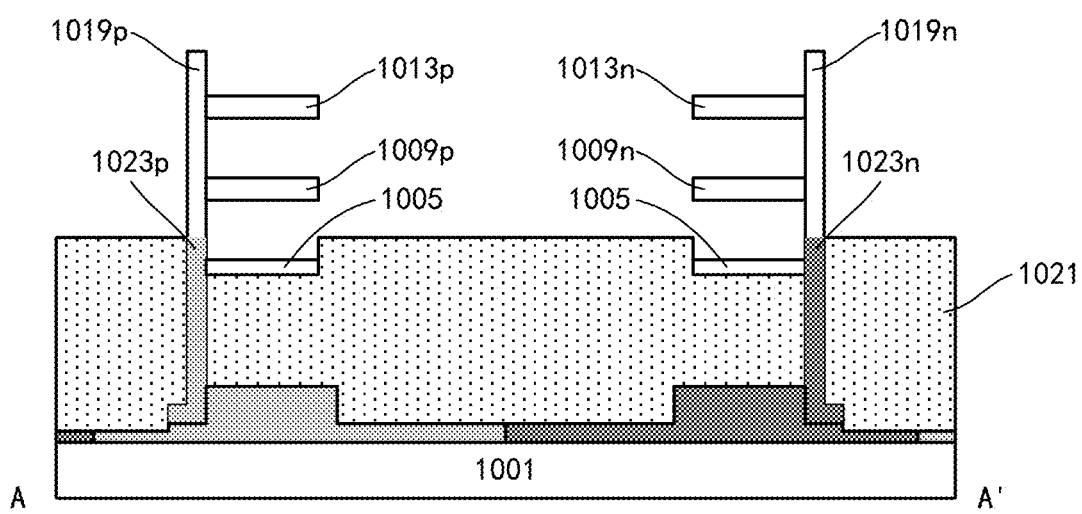

As shown in FIG. 13, the hard mask layer 1017 and the second etch stop layer 1101 may be removed by selective etching such as RIE. In addition, the second sacrificial layers 1007, 1011, 1015 formed of SiGe may be selectively etched with respect to the first active layers 1009, 1013, the second active layer 1019 and the etch stop layer 1005 formed of Si by, for example, atomic layer etching (ALE), so that the second sacrificial layers 1007, 1011, 1015 may be removed. In this way, respective comb-like structures for the p-type device and the n-type device are obtained. As shown in FIG. 13, for the p-type device/n-type device, the comb-like structure includes a first portion 1019*p*/1019*n* extending in a vertical direction and a second portion 1009*p*/1009*n*, 1013*p*/1013*n* extending from the first portion 1019*p*/1019*n* in a lateral direction. In this example, there are two second portions in each device. However, the present disclosure is not limited thereto, and the number of the second portions may be more, for example, three or more, or less, for example, one.

The second portions of respective comb-like structures of two adjacent devices may extend towards each other. Alternatively, the second portions of the respective comb-like structures of two adjacent devices may extend away from each other, for example, in two middle ones of four comb-like structures obtained by two adjacent ridge structures. According to the above method, opposing second portions in two adjacent devices may be present in pairs. However, the present disclosure is not limited thereto, for example, due to fluctuations in the process or for the purpose of structure adjustment, some comb teeth in the comb-like structure, i.e., the second portion, may also be missing.

Figure 14:
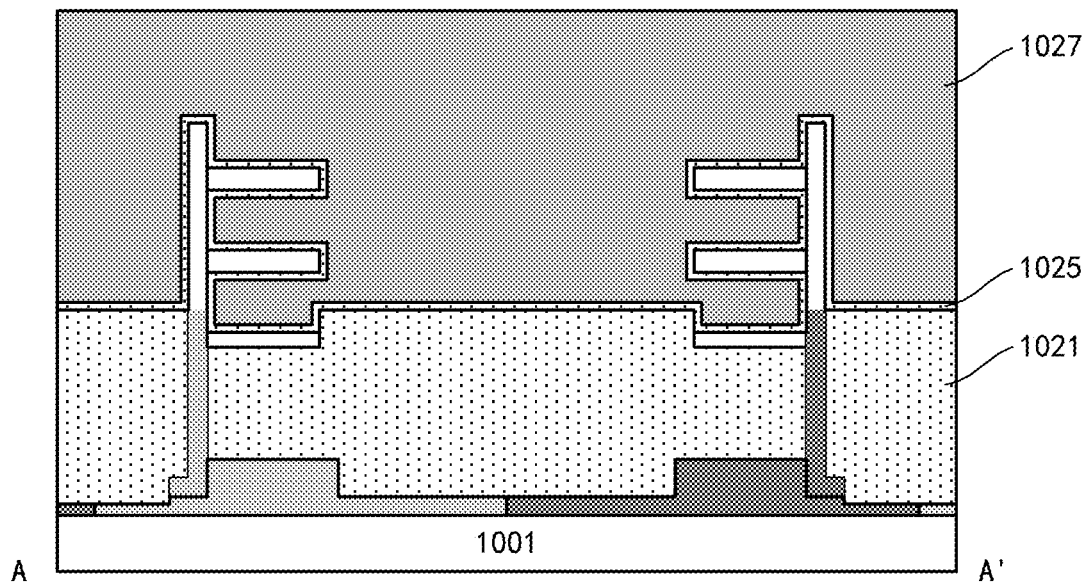
Figure 15A:
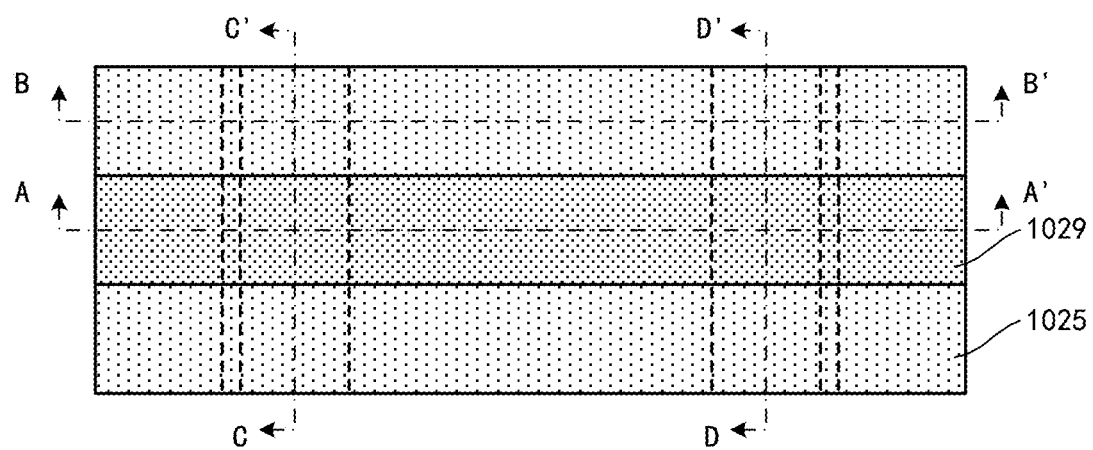
Figure 15B:
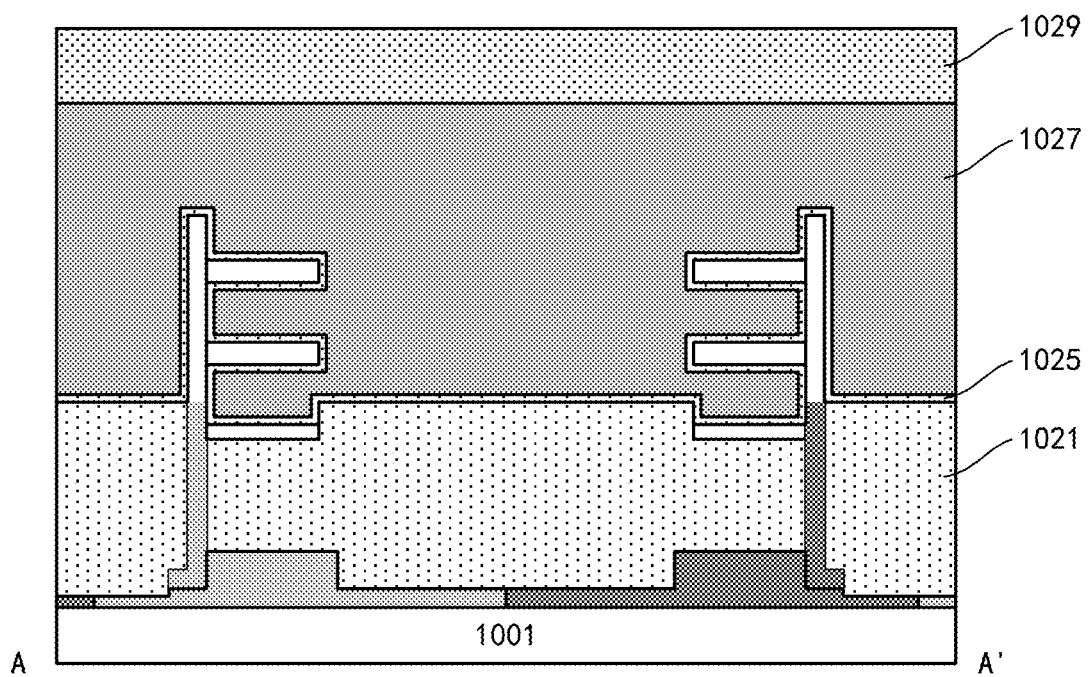
Figure 15C:
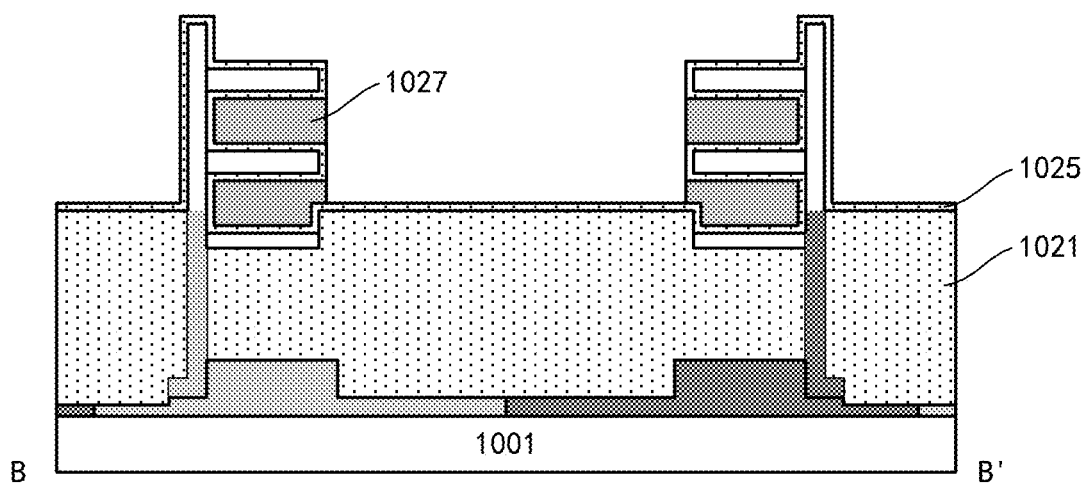
FIGS. 15(c), 17(a), 18(b), 21(a), 22(a), 23(b) are cross-sectional views taken along line BB'.
Figure 15D:
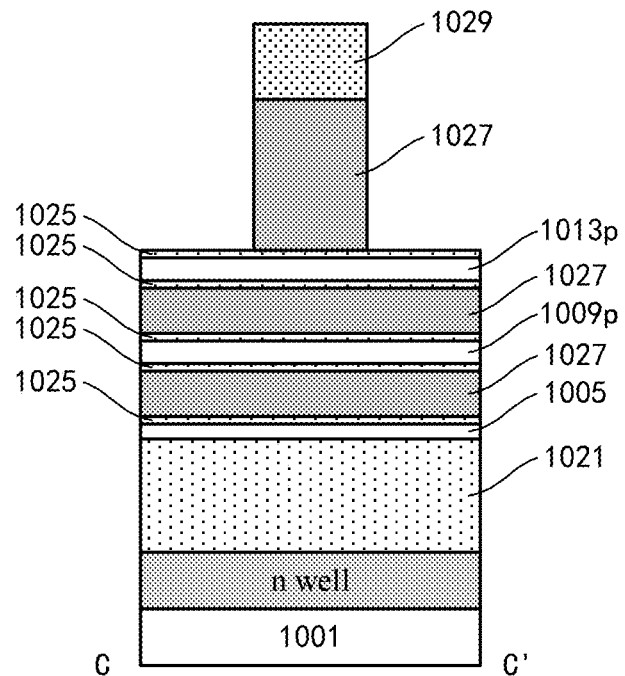

As shown in FIG. 14, a sacrificial gate stack may be formed on the isolation layer 1021. The sacrificial gate stack may include a sacrificial gate dielectric layer 1025 and a sacrificial gate conductor layer 1027. The sacrificial gate dielectric layer 1025 may include oxide, for example, formed by deposition or thermal oxidation. The sacrificial gate conductor layer 1027 may comprise polycrystalline SiGe (about 10-40 atomic percent of Ge), for example, formed by deposition followed by planarization such as CMP. Due to the removal of the second sacrificial layer, the formed sacrificial gate stack may surround a portion of each of the first active layers 1009, 1013 and the second active layer 1019 above the top surface of the isolation layer 1021. In this example, both the sacrificial gate dielectric layer 1025 and the isolation layer 1021 include oxide, so they may be shown integrally.

As shown in FIGS. 15(*a*) to 15(*d*), the sacrificial gate stack may be patterned into a stripe shape extending in the second direction. Specifically, a hard mask layer 1029 may be formed on the sacrificial gate stack. The hard mask layer 1029 may include nitride, for example, with a thickness of about 15-150 nm. A photoresist (not shown) may be formed on the hard mask layer 1029 and patterned into strips extending in the second direction by photolithography (see the top view of FIG. 15(*a*)). Then, using the photoresist as an etching mask, the hard mask layer 1029 and the sacrificial gate conductor layer 1027 are sequentially selectively etched by, for example, RIE. The selective etching may stop at the sacrificial gate dielectric layer 1025 formed of the oxide.

Referring to FIG. 15(*c*), on opposite sides of the strip-shaped hard mask layer 1029 extending in the second direction in the first direction (i.e., upper and lower sides of the strip-shaped hard mask layer 1029 in the top view of FIG. 15(*a*)), due to the existence of the first active layer, a portion of the sacrificial gate conductor layer 1027 located under each of the first active layers may remain.

Figure 16:
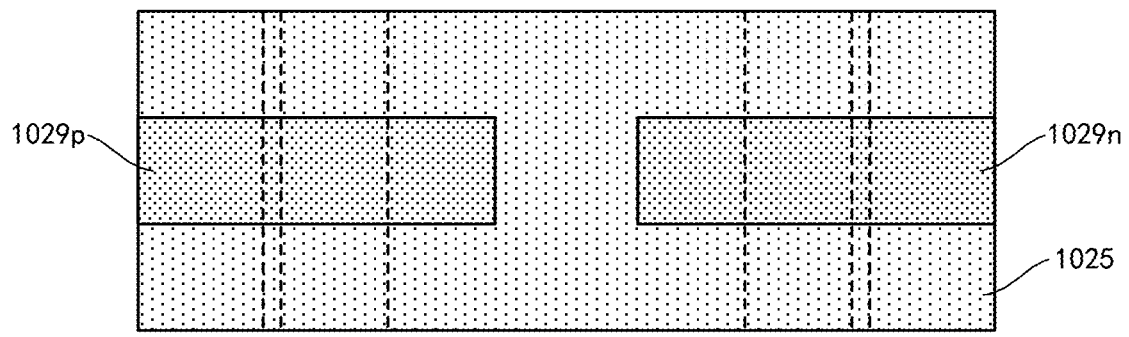

In this example, the sacrificial gate stacks of the p-type device and the n-type device extend continuously in the second direction. However, the present disclosure is not limited thereto. For example, as shown in FIG. 16, the sacrificial gate stacks of the p-type device and the n-type device may be separated from each other.

Figure 17A:
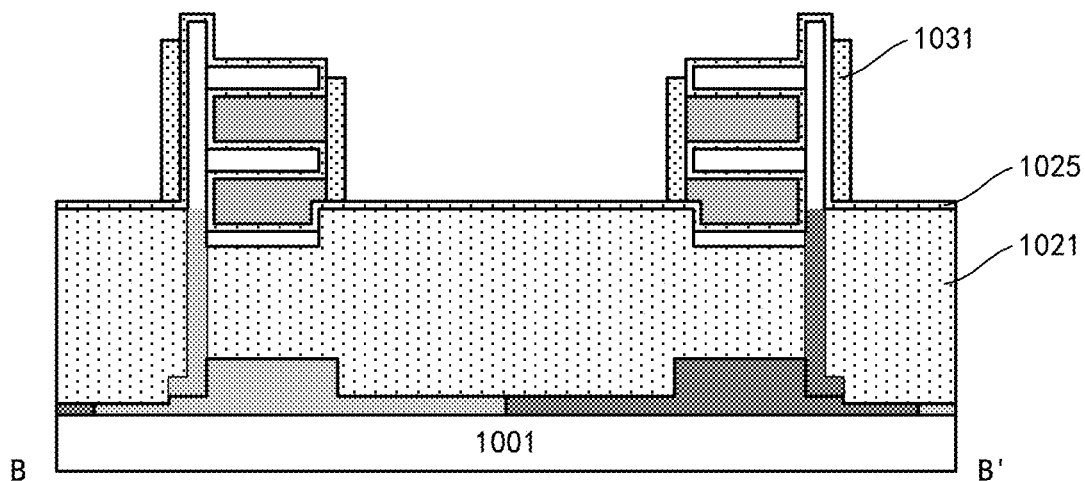
Figure 17B:
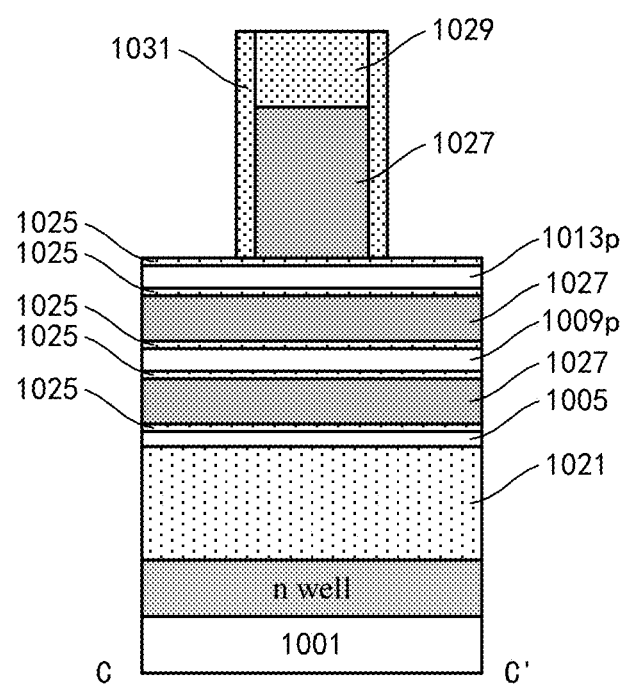

As shown in FIGS. 17(*a*) and 17(*b*), first spacers 1031 may be formed on sidewalls of the sacrificial gate stack. For example, a layer of about 1-3 nm of nitride may be deposited in a substantially conformal manner, and then the deposited nitride layer may be anisotropically etched in the vertical direction to remove its laterally extending portion while leaving its vertically extending portion, thereby obtaining the first spacers 1031. Before depositing the nitride layer, an etch stop layer may also be formed, for example, by deposition. The etching for the nitride layer may be stopped at the etch stop layer. Since the ridge structure (currently including the first active layer, the second active layer and the remaining sacrificial gate stack) also has vertical sidewalls, the first spacers may also be formed on the sidewalls of the ridge structure, as shown in FIG. 17(*a*).

Figure 18A:
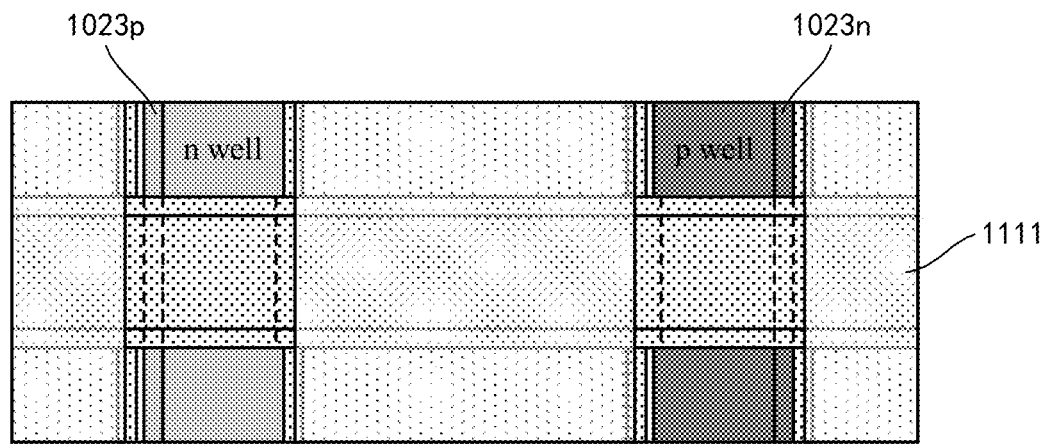
Figure 18B:
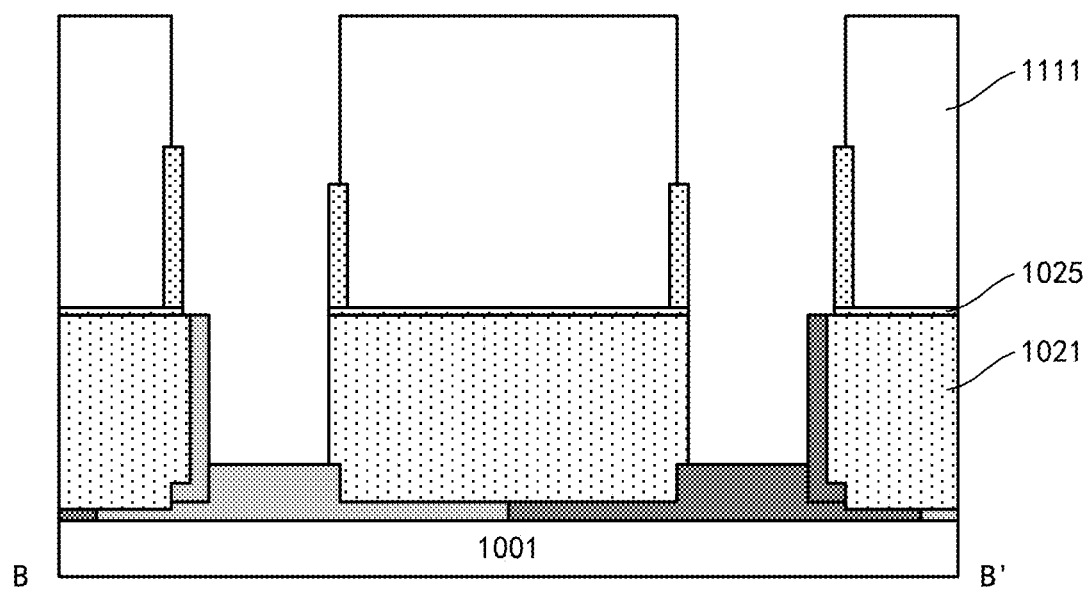
Figure 18C:
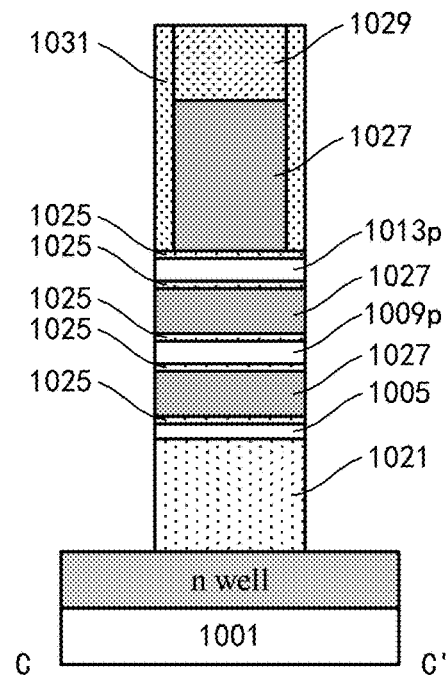

In order to facilitate the growth of an integrated source/drain portion, especially in the case where the lower portion of the second active layer is removed as described above, the substrate 1001 may be exposed at the region where the source/drain portion will be formed to serve as a seed for growth of the source/drain portion. In the source/drain region, in the process of exposing the substrate 1001, the isolation layer 1021 above it needs to be removed. To avoid removing the isolation layer 1021 in other regions, as shown in FIGS. 18(*a*) to 18(*c*), a photoresist 1111 may be formed. Openings may be formed in the photoresist 1111 to expose regions of the source/drain portions. For example, in the region of the source/drain portion, openings may be formed along the first spacers 1031. In addition, a hard mask layer 1029 may extend integrally with regard to the openings facing each other on opposite sides so that the openings generally expose regions where the active stacks are located.

Referring to FIGS. 17(*a*) and 18(*b*), by using the photoresist 1111 (as well as the hard mask layer 1029 and the first spacer 1031 exposed by the opening) as a mask, the sacrificial gate dielectric layer, the first active layer 1013, the sacrificial gate dielectric layer, the sacrificial gate conductor layer, the sacrificial gate dielectric layer, the first active layer 1009, the sacrificial gate dielectric layer, the sacrificial gate conductor layer, the sacrificial gate dielectric layer and the isolation layer 1021 are sequentially selectively etched by, for example, RIE, to expose the substrate 1001.

In this way, the sacrificial gate stack may be formed in a stripe shape extending in the second direction corresponding to the hard mask layer 1029. Due to the above process, except for a portion of the comb-like structure left under the sacrificial gate stack and the first spacer formed on the sidewalls of the sacrificial gate stack, the comb-like structure is substantially removed (except for the lower portion of the second active layer 1009 that may remain in the source/drain region), thereby forming a comb-like channel portion. The second portions of the channel portion, i.e., the first active layers, may have substantially the same shape, and may be substantially aligned in the vertical direction. In addition, under the channel portion, the sidewall of the isolation layer 1021 may be substantially aligned with the sidewall of the first spacer 1031. Afterwards, the photoresist 1111 may be removed.

Source/drain portions connected to exposed sidewalls of the channel portion may be formed on both sides of the sacrificial gate stack (and the first spacers on the sidewalls thereof).

Figure 19:
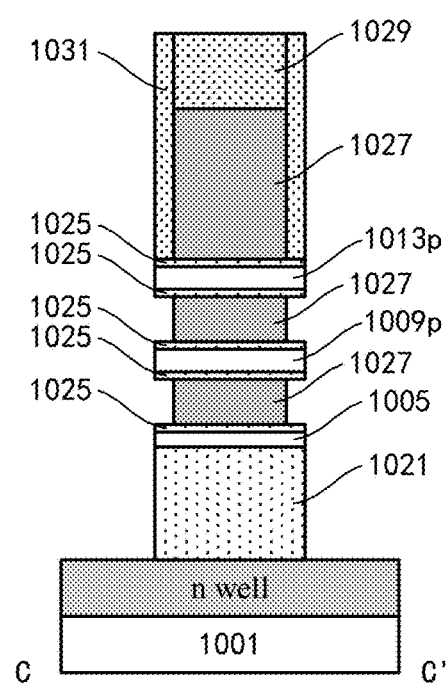
Figure 20:
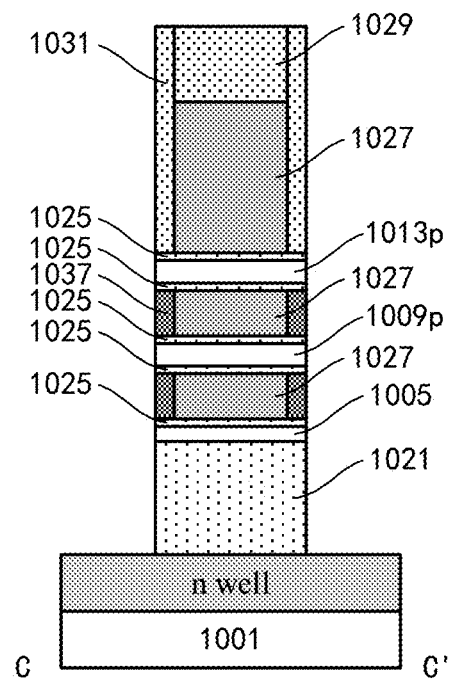

In order to reduce the capacitance between the subsequently formed gate stack and the source/drain portions, a dielectric may be further inserted between the gate stack and the source/drain portions. To this end, as shown in FIG. 19, the sacrificial gate conductor layer 1027 may be selectively etched (here, it may be isotropic etching) so as to be relatively recessed. Here, atomic layer etching (ALE) may be used to control the etch depth well. The concave degree of the sacrificial gate conductor layer 1027 may be approximately the same everywhere. Then, as shown in FIG. 20, second spacers 1037 may be formed on the sidewalls of the relatively concave sacrificial gate conductor layer 1027. The second spacer 1037 may be formed by a process of deposition and then etch back. Therefore, an outer sidewall of the second spacer 1037 may be substantially aligned with an outer sidewall of the first spacer 1031. For example, the second spacer 1037 may include a low-k dielectric material such as SiC. According to the embodiment of the present disclosure, the etching depth of the sacrificial gate conductor layer 1027 may be controlled, so that the thickness of the second spacer 1037 and the thickness of the first spacer 1031 are substantially the same. In this way, the sacrificial gate stacks (and subsequently gate stacks formed therefrom) on upper and lower sides of the first active layer may have substantially the same gate length.

Next, source/drain portions may be formed on the substrate 1001 exposed in the regions of the source/drain portions. In this example, the source/drain portions are formed for the p-type device and the n-type device, respectively.

Figure 21A:
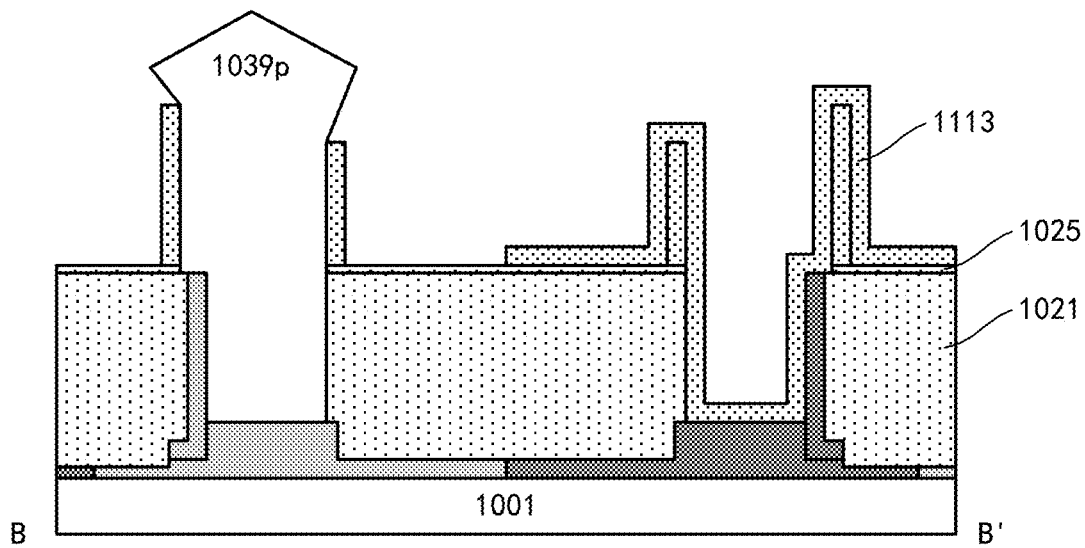
Figure 21B:
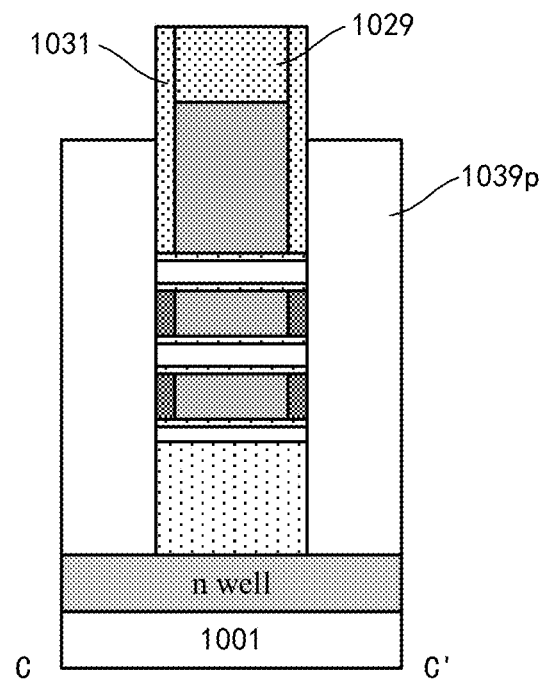

As shown in FIGS. 21(*a*) and 21(*b*), the n-type device region may be shielded with a shielding layer 1113, and a source/drain portion 1039*p* may be formed in the p-type device region by, for example, epitaxial growth. The shielding layer 1113 may include nitride. An etch stop layer of oxide may also be formed, for example, by deposition, before forming the shielding layer of nitride. The source/drain portion 1039*p* may be grown from the exposed surface of the substrate 1001 and surfaces of the respective first and second active layers. The source/drain portion 1039*p* may be in-situ doped as grown to a conductivity type corresponding to the device to be formed, for example, p-type for the p-type device. The grown source/drain portion 1039*p* may have a different material (for example, have a different lattice constant) from the channel portion in order to apply stress to the channel portion. For example, for the p-type device, the source/drain portion 1039*p* may include SiGe (for example, about 10-75 atomic percent of Ge). After that, the shielding layer 1113 may be removed.

On opposite sides of the sacrificial gate stack, source/drain portions 1039*p* are integrally formed. As shown in FIG. 21(*b*), the first active layer in the form of a nanosheet connects the source/drain portions 1039*p* on opposite sides thereof, thereby forming a second portion of the channel portion, similar to an MBCFET. In addition, the second active layer 1019*p* connects the source/drain portions 1039*p* on opposite sides thereof, thereby forming a first portion of the channel portion, similar to a FinFET.

Figure 22A:
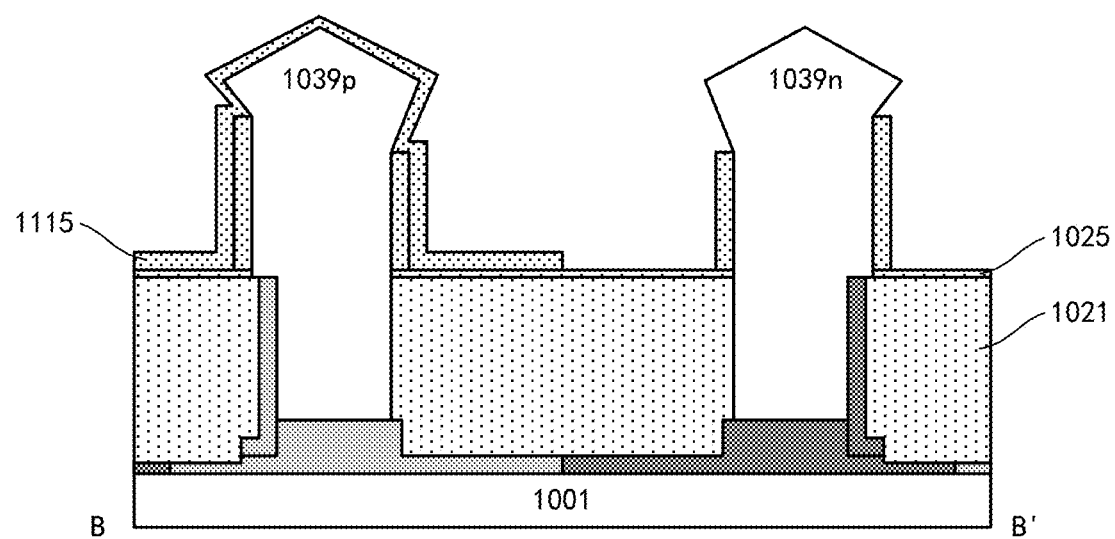
Figure 22B:
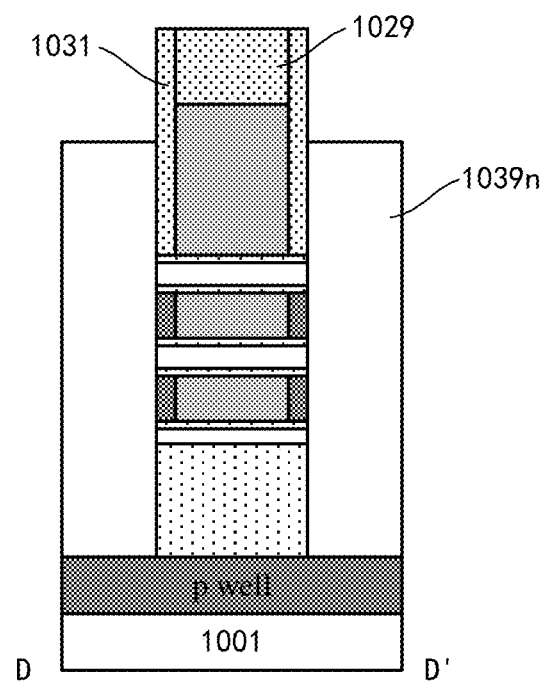
Figure 23A:
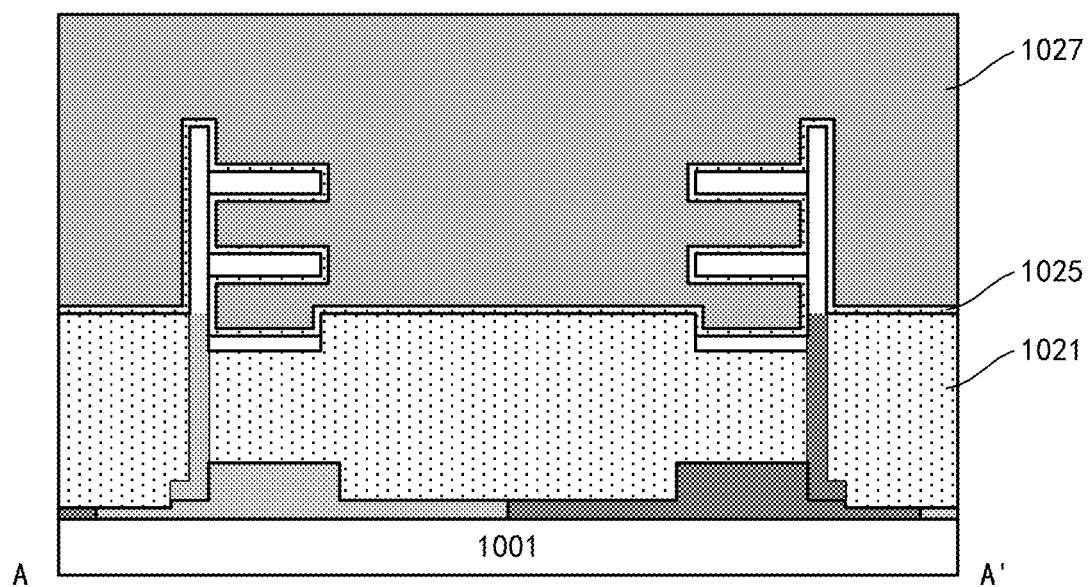
Figure 23B:
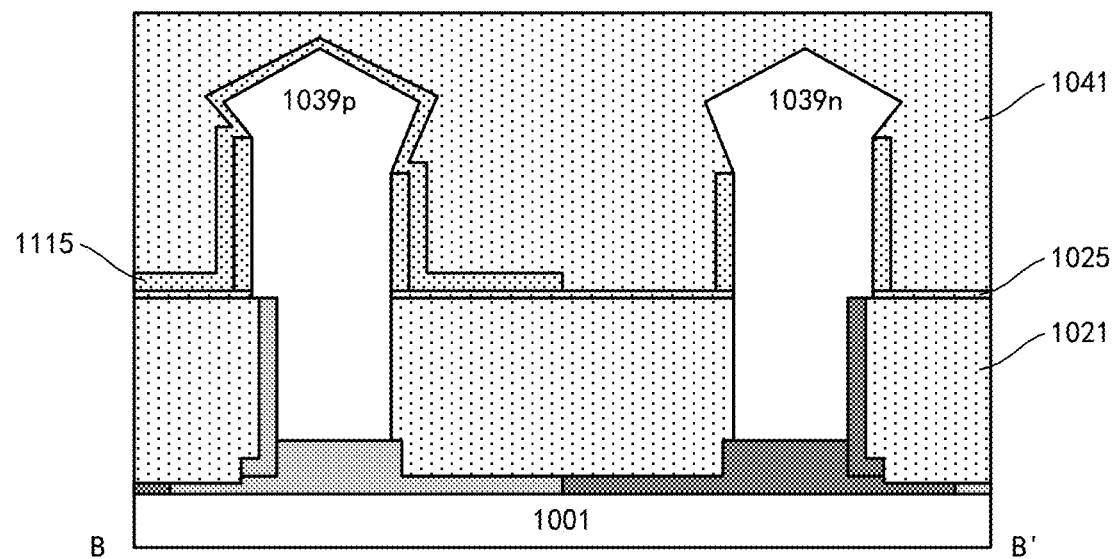
Figure 23C:
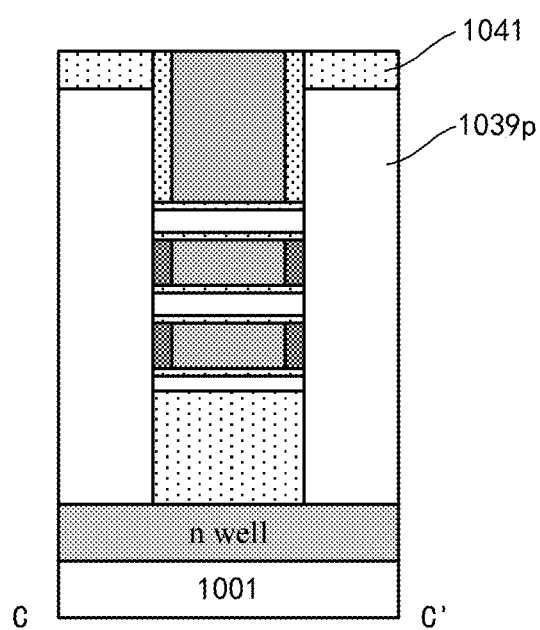
Figure 23D:
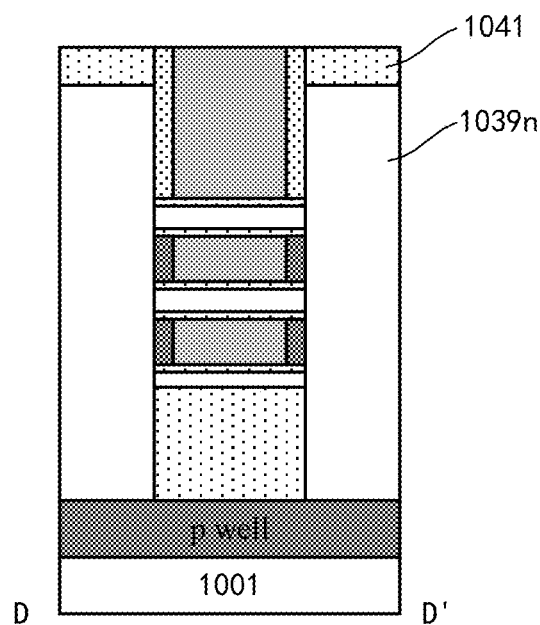

Similarly, as shown in FIGS. 22(*a*) and 22(*b*), the p-type device region may be shielded with a shielding layer 1115, and a source/drain portion 1039*n* may be formed in the n-type device region by, for example, epitaxial growth. The shielding layer 1115 may include nitride. An etch stop layer of oxide may also be formed, for example, by deposition, before forming the shielding layer of nitride. The source/drain portion 1039*n* may be grown from the exposed surface of the substrate 1001 and the surfaces of the respective first and second active layers. The source/drain portion 1039*n* may be in-situ doped as grown to a conductivity type corresponding to the device to be formed, for example, n-type for the n-type device. The grown source/drain portion 1039*n* may be of a different material (for example, having a different lattice constant) from the channel portion in order to apply stress to the channel portion. For example, for the n-type device, the source/drain portion 1039*n* may include SiC (for example, about 0.5-3 atomic percent of C). The shielding layer 1115 may be retained or removed.

On opposite sides of the sacrificial gate stack, source/drain portions 1039n are integrally formed. As shown in FIG. 22(h), the first active layer in the form of a nanosheet connects the source/drain portions 1039n on opposite sides thereof, thereby forming a second portion of the channel portion, similar to an MBCFET. In addition, the second active layer 1019n connects the source/drain portions 1039n on opposite sides thereof, thereby forming a first portion of the channel portion, similar to a FinFET.

Next, a replacement gate process may be performed to complete device manufacture.

As shown in FIGS. 23(a) to 23(d), an interlayer dielectric layer 1041 may be formed on the substrate 1001, for example, by depositing a dielectric material such as oxide, to cover the sacrificial gate stack, the source/drain portions 1039p/1039n and the isolation layer 1021. A planarization process such as CMP may be performed on the interlayer dielectric layer 1041 to expose the sacrificial gate conductor layer 1027.

Figure 24A:
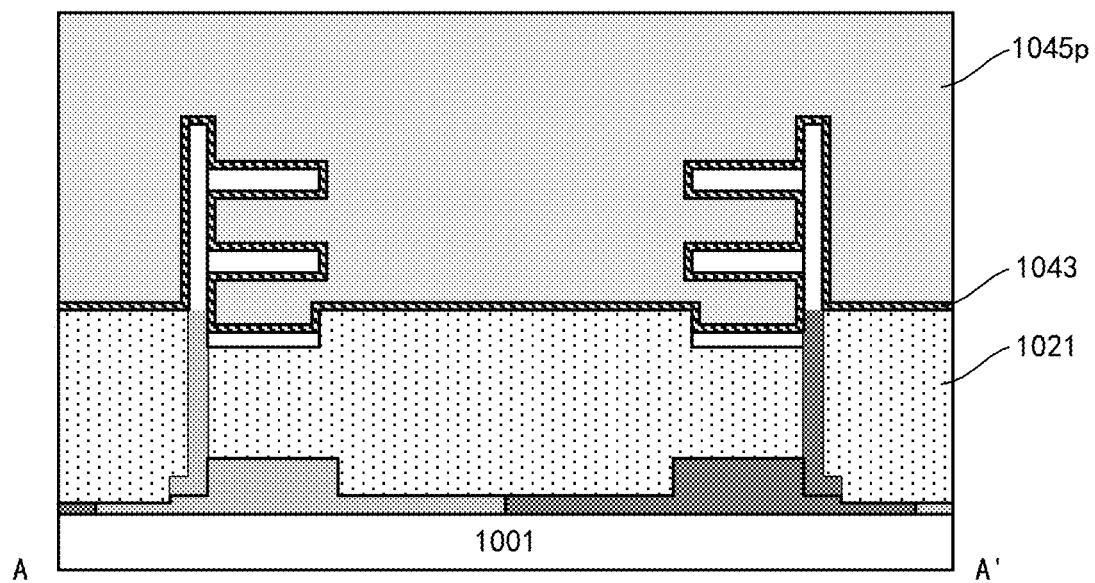
Figure 24B:
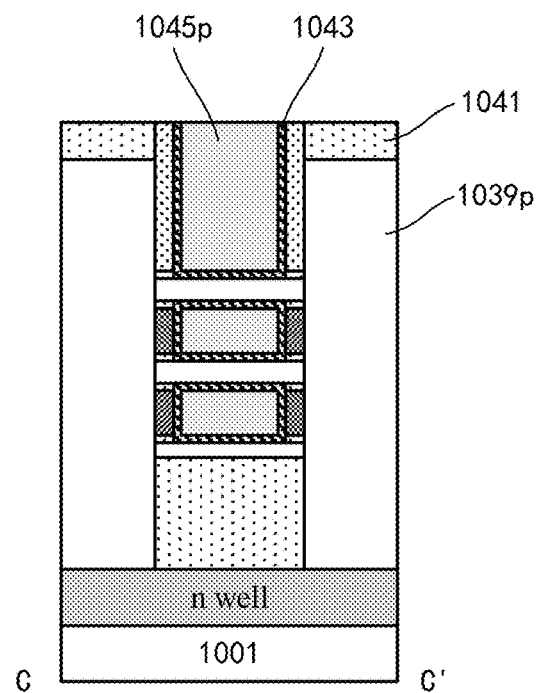
Figure 24C:
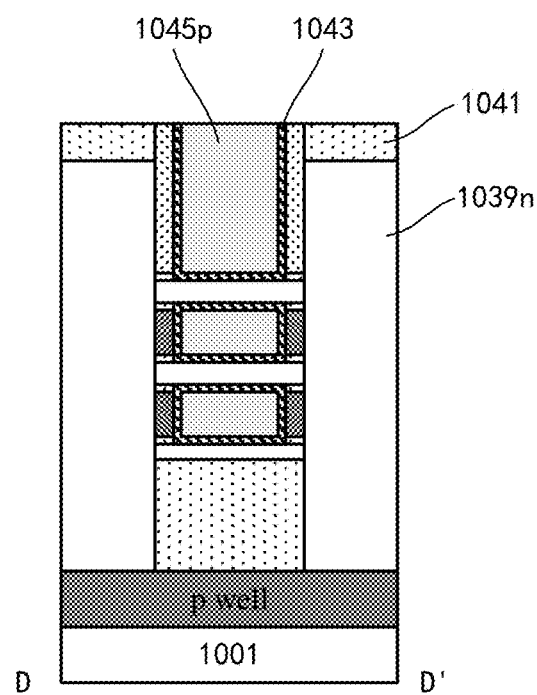

As shown in FIGS. 24(a) to 24(c), the sacrificial gate conductor layer 1027 and the sacrificial gate dielectric layer 1025 may be removed by selective etching, thereby forming spaces inside the first spacer 1031 and the second spacer 1037. A gate stack may be formed in the spaces. For example, the gate dielectric layer 1043 and the gate conductor layer 1045p may be sequentially formed by a process such as deposition and then planarization such as CMP. The gate dielectric layer 1043 may be formed in a substantially conformal manner, with a thickness of, for example, about 2-5 nm, and may include a high-k gate dielectric such as $HfO_2$. Before forming the high-k gate dielectric, an interface layer, for example, an oxide formed by an oxidation or deposition process such as atomic layer deposition (ALD), with a thickness of about 0.2-2 nm, may also be formed on the surface of the channel portion. Here, the gate conductor layer 1045p is used for the p-type device, and may include a work function adjusting metal such as TiN, TaN, etc., and a gate conductive metal such as W and the like.

Figure 25A:
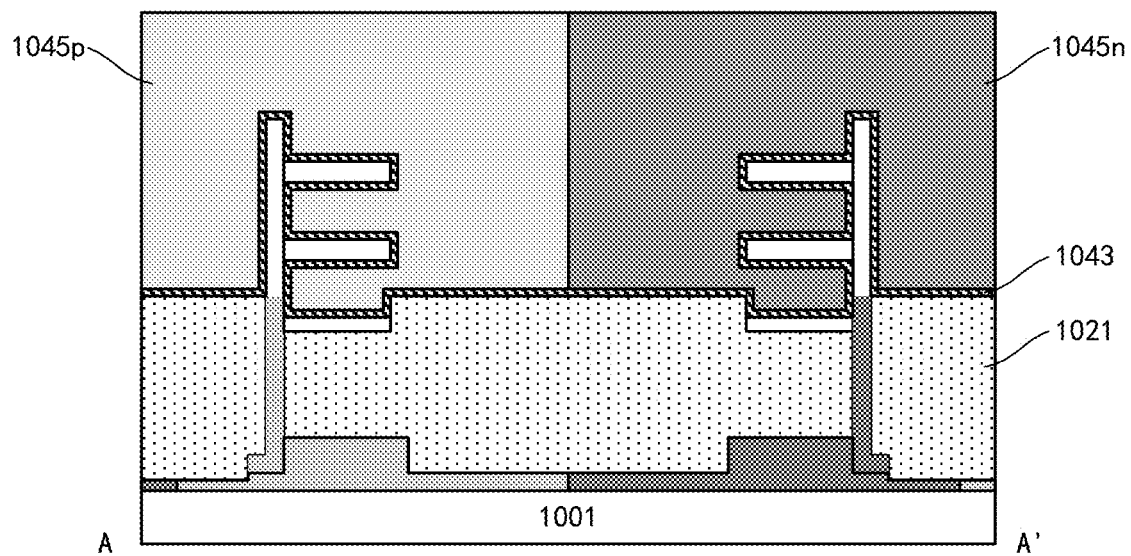
Figure 25B:
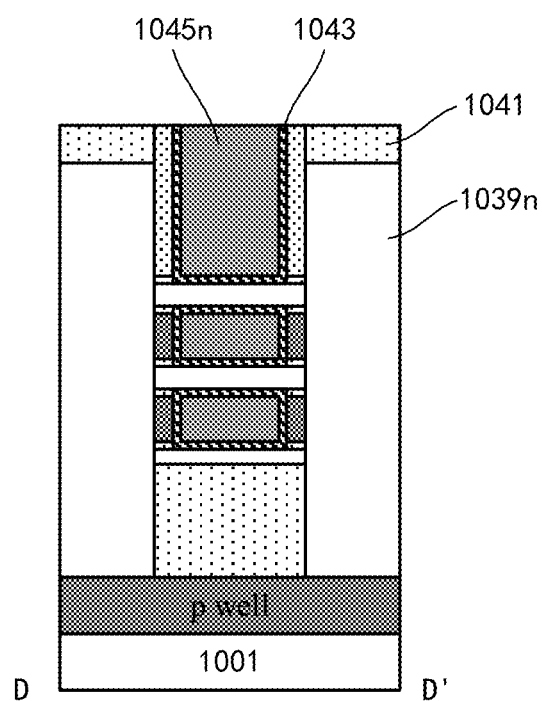

As shown in FIGS. 25(a) and 25(b), a shielding layer such as photoresist, etc. (not shown) may be used to shield the p-type device region and expose the n-type device region. In the n-type device region, the gate conductor layer 1045p for the p-type device may be removed by selective etching, and the gate conductor layer 1045n for the n-type device may be formed. Similarly, the gate conductor layer 1045n may include a work function adjusting metal such as TiN, TaN, TiAlC, etc, and a gate conductive metal such as W or the like.

In this example, the p-type device and the n-type device have the same gate dielectric layer 1043, However, the present disclosure is not limited thereto. For example, the p-type device and the n-type device may have different gate dielectric layers. When different materials are used for different types of devices, they may be treated separately. As described above, when one type of device is processed, a shielding layer may be used to shield the region where another type of device is located. Their processing order may be swapped.

Figure 26A:
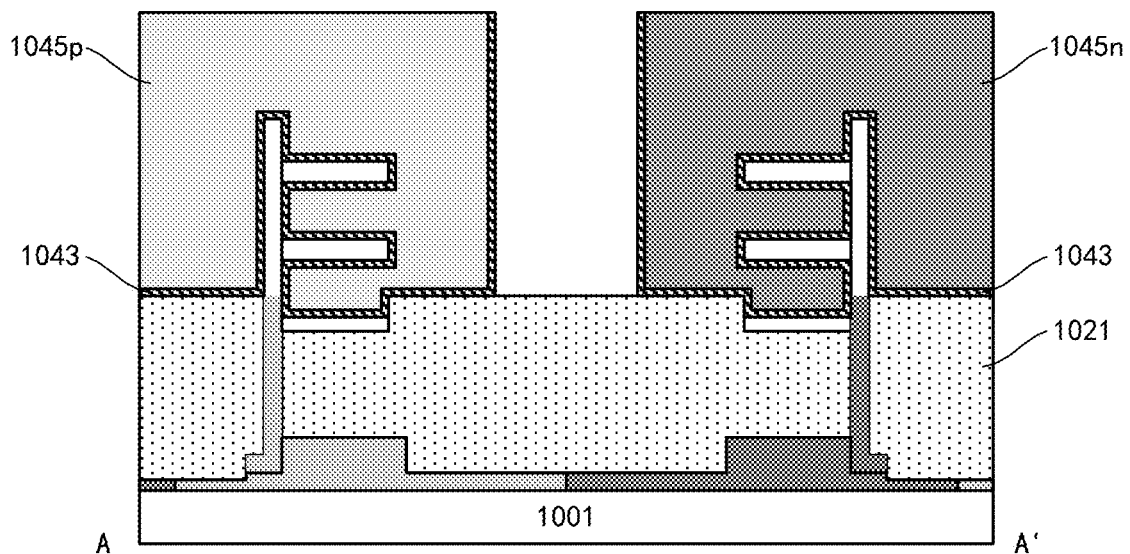

In addition, in the above embodiments, the gate conductor layers of adjacent p-type device and n-type device are connected together. However, the present disclosure is not limited thereto. For example, as shown in FIG. 26(a), the gate conductor layers of adjacent p-type device and n-type device may be separated from each other. This may be achieved by patterning the sacrificial gate stack in the method shown in FIG. 16.

Figure 11A:
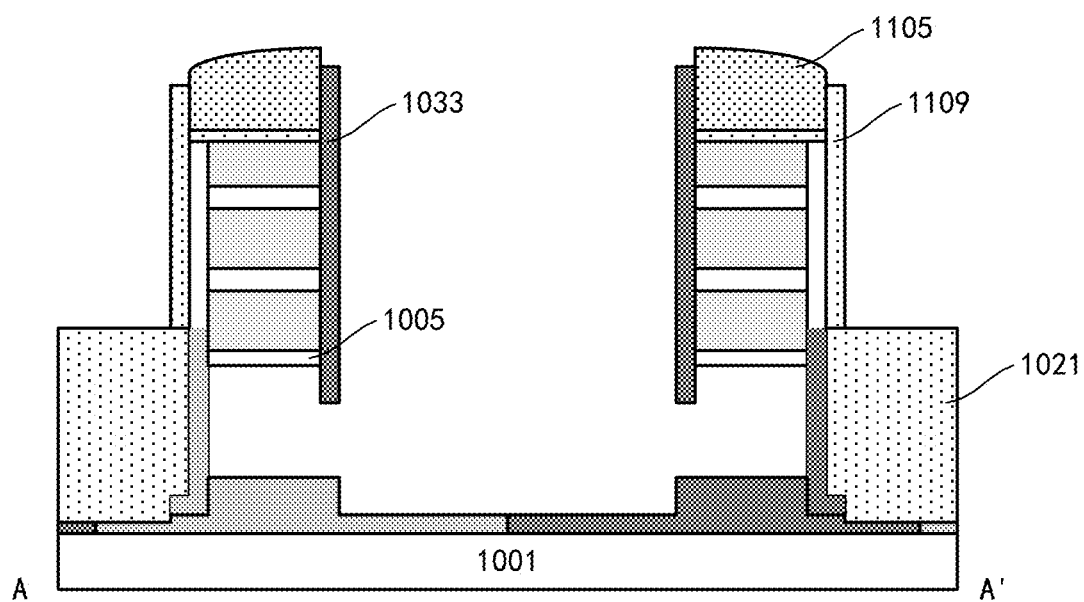
Figure 11B:
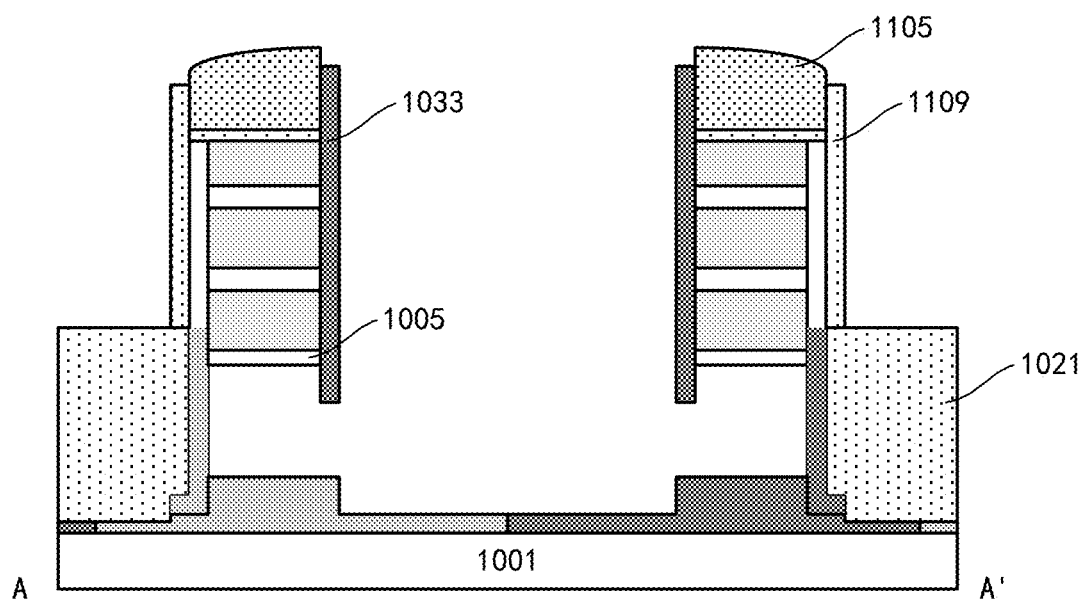
Figure 11C:
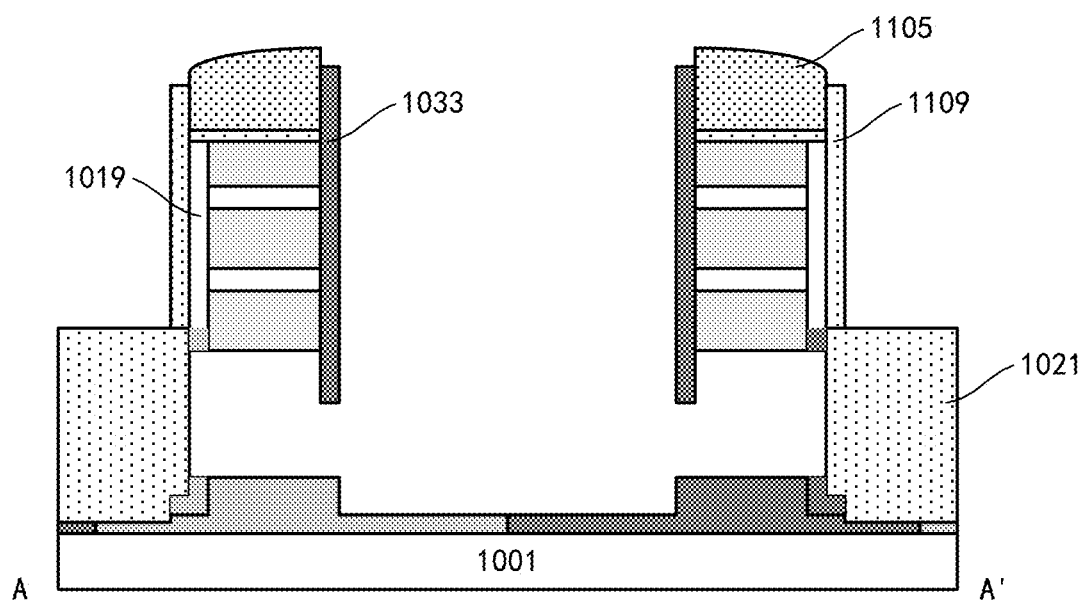
Figure 11D:
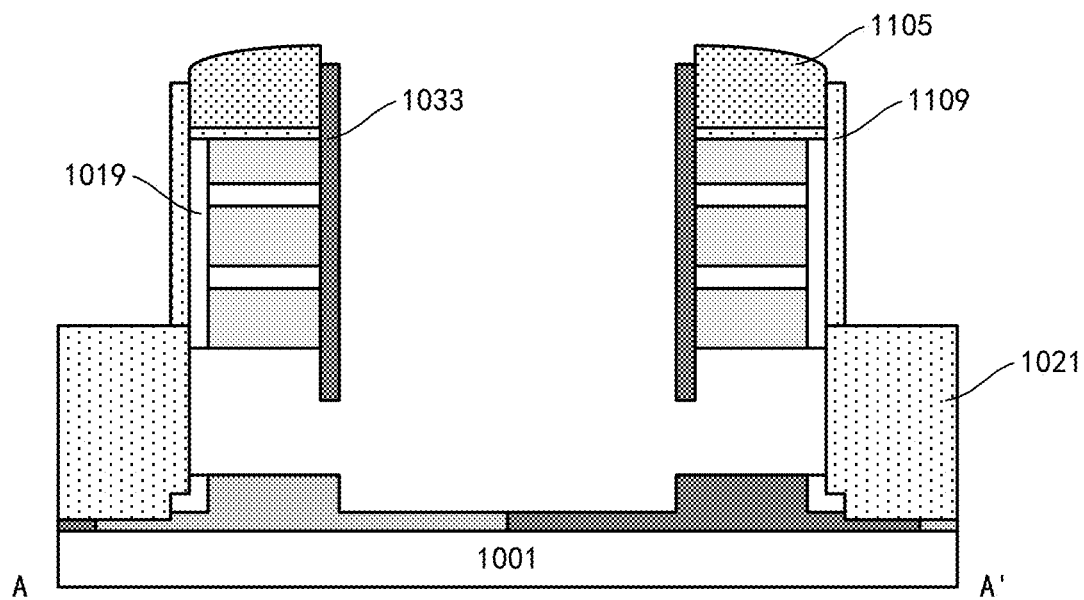
Figure 26B:
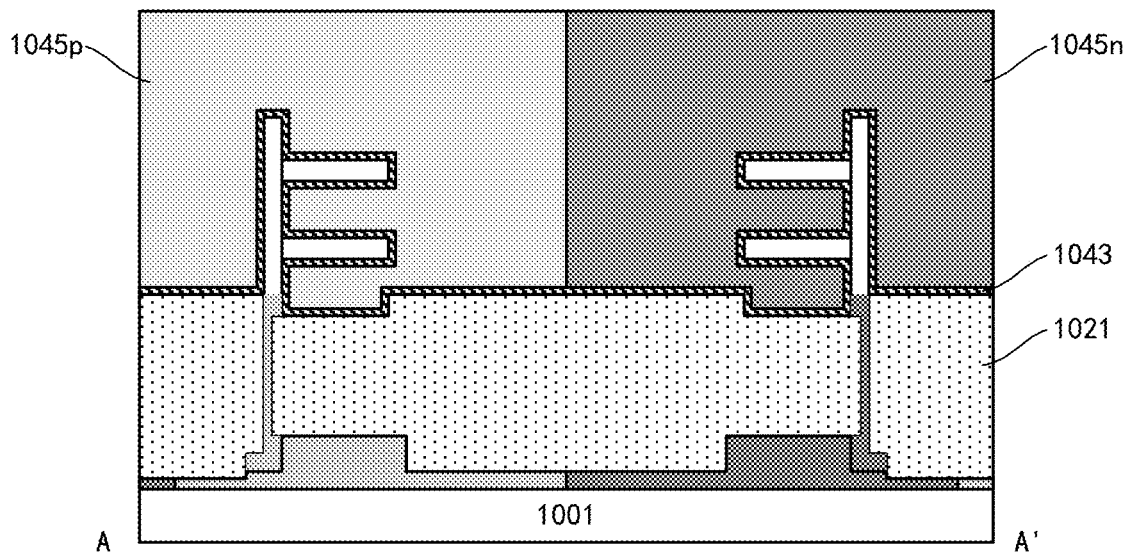
Figure 26C:
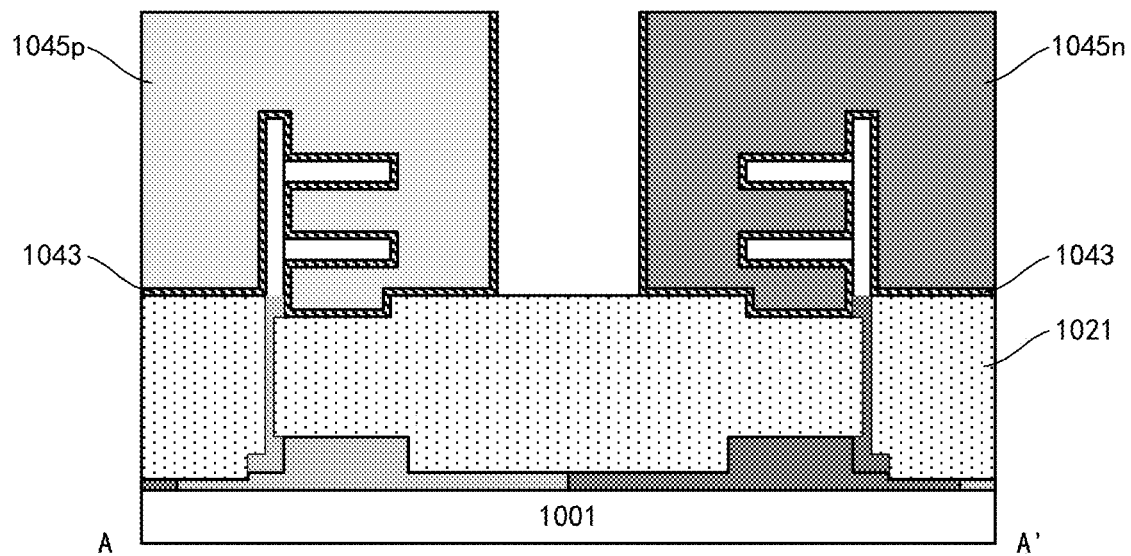
Figure 26D:
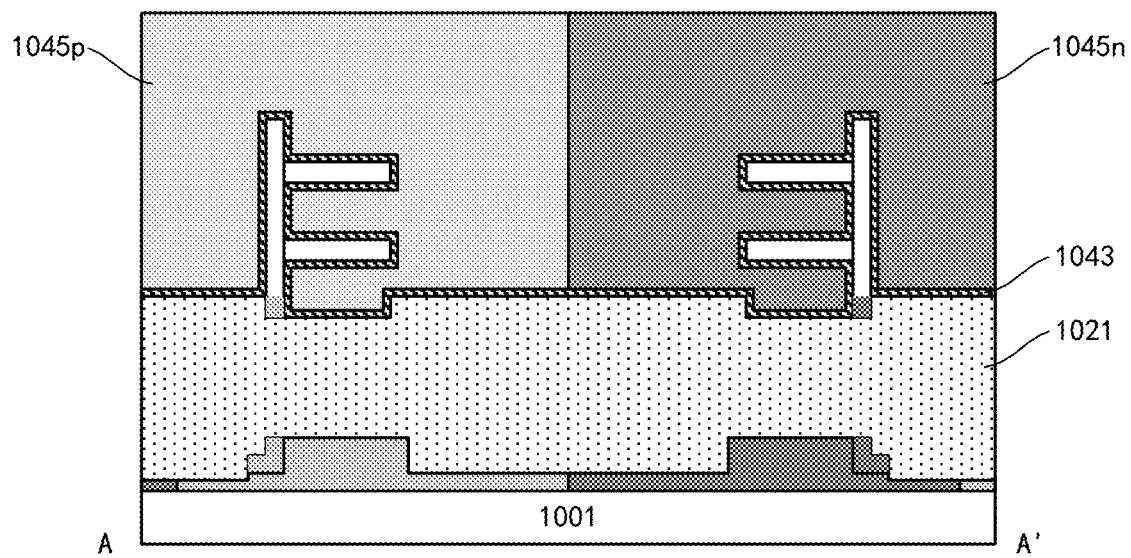
Figure 26E:
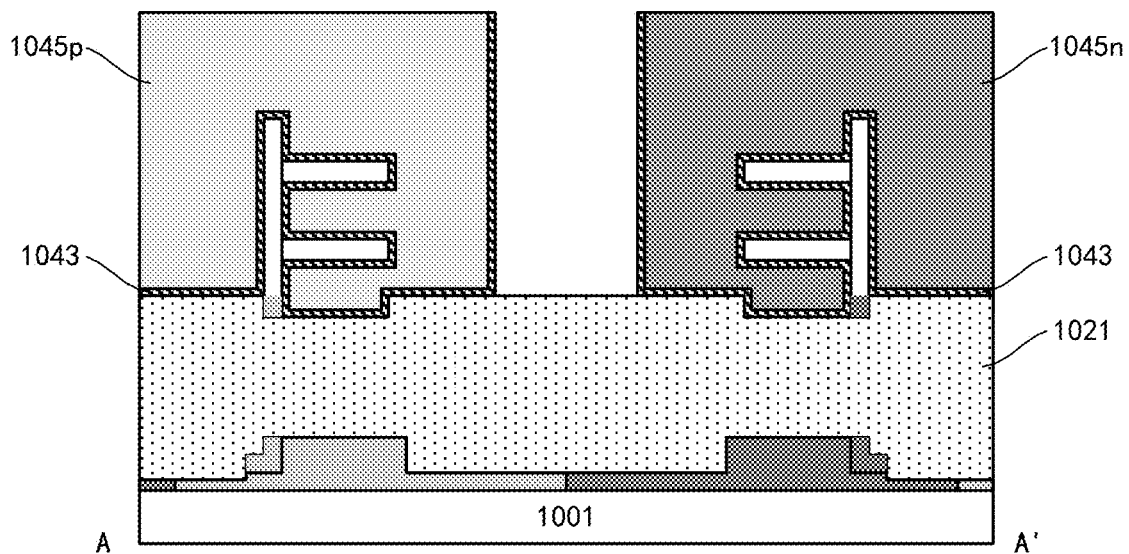
Figure 26F:
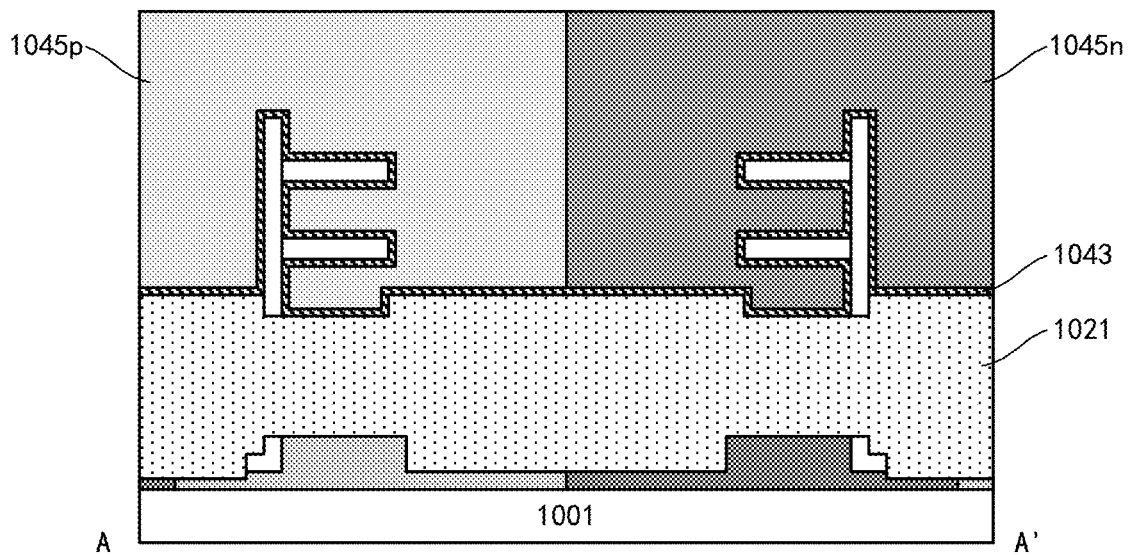
Figure 26G:
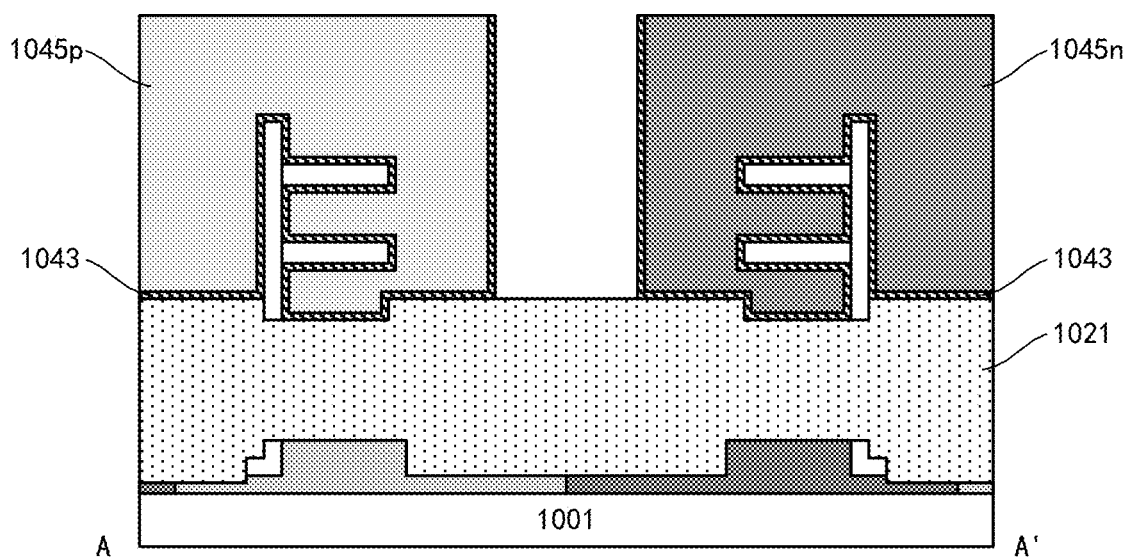

FIG. 26(b) shows a state in which a semiconductor apparatus in which the gate conductor layers of adjacent p-type device and n-type device are connected together is formed on the basis of the structure shown in FIG. 11(b), FIG. 26(c) shows a state in which a semiconductor apparatus in which the gate conductor layers of adjacent p-type device and n-type device are separated from each other is formed on the basis of the structure shown in FIG. 11(b), FIG. 26(d) shows a state in which a semiconductor apparatus in which the gate conductor layers of adjacent p-type device and n-type device are connected together is formed on the basis of the structure shown in FIG. 11(c), FIG. 26(e) shows a state in which a semiconductor apparatus in which the gate conductor layers of adjacent p-type device and n-type device are separated from each other is formed on the basis of the structure shown in FIG. 11(c), FIG. 26(f) shows a state in which a semiconductor apparatus in which the gate conductor layers of adjacent p-type device and n-type device are connected together is formed on the basis of the structure shown in FIG. 11(d), FIG. 26(g) shows a state in which a semiconductor apparatus in which the gate conductor layers of adjacent p-type device and n-type device are separated from each other is formed on the basis of the structure shown in FIG. 11(d).

The semiconductor apparatus according to the embodiments of the present disclosure may be applied to various electronic equipment. For example, an integrated circuit (IC) may be formed based on such a semiconductor apparatus, and an electronic equipment may be constructed therefrom. Accordingly, the present disclosure also provides an electronic equipment including the above-described semiconductor apparatus. The electronic equipment may also include components such as a display screen cooperating with the integrated circuit and a wireless transceiver cooperating with the integrated circuit. Such electronic equipment is, for example, smart phones, computers, tablet computers (PCs), wearable smart devices, power banks, and the like.

According to some embodiments of the present disclosure, a method of manufacturing a system on a chip (SoC) is also provided. The method may include the methods described above. Specifically, a variety of devices may be integrated on a chip, at least some of which are fabricated according to the methods of the present disclosure.

In the above description, technical details such as patterning and etching of each layer are not described in detail. However, those skilled in the art should understand that various technical means may be used to form layers, regions, etc. of desired shapes. In addition, in order to form the same structure, those skilled in the art may also design methods that are not exactly the same as those described above. Additionally, although the various embodiments have been described above separately, this does not mean that the measures in the various embodiments cannot be used in combination.

Embodiments of the present disclosure have been described above. However, these embodiments are merely for illustrative purposes, and are not intended to limit the scope of the present disclosure. The scope of the present disclosure shall be defined by appended claims and their equivalents. Without departing from the scope of the present disclosure, those skilled in the art can make various substitutions and modifications, and these substitutions and modifications should all fall within the scope of the present disclosure.

What is claimed is:

1. A semiconductor apparatus comprising a first device and a second device that are opposite to each other on a substrate, wherein each of the first device and the second device comprises:
   a channel portion, comprising:
      a first portion extending in a vertical direction relative to the substrate; and
      a second portion extending from the first portion in a lateral direction relative to the substrate;
   source/drain portions, wherein the source/drain portions are provided on both sides of the channel portion in a first direction substantially parallel to a surface of the substrate, and the source/drain portions are in contact with sidewalls of the channel portion on the both sides of the channel portion; and
   a gate stack, wherein the gate stack extends in a second direction intersecting the first direction, and the gate stack overlaps the channel portion,
   wherein the second portion of the channel portion of the first device and the second portion of the channel portion of the second device extend toward or away from each other, and
   wherein the first portion is formed in a form of a fin, and the second portion is formed in a form of a nanosheet.

2. The semiconductor apparatus of claim 1, wherein the second portion of the channel portion of the first device is substantially coplanar with the second portion, that is opposite to the second portion of the channel portion of the first device, of the channel portion of the second device.

3. The semiconductor apparatus of claim 1, wherein the channel portion of at least one of the first device and the second device comprises a plurality of the second portions, that are spaced apart from one another in the vertical direction.

4. The semiconductor apparatus of claim 3, wherein the second portion of the channel portion of the first device and the second portion of the channel portion of the second device are provided in pairs, each pair of second portions being opposite to and substantially coplanar with each other.

5. The semiconductor apparatus of claim 3, wherein the plurality of second portions of the channel portion of at least one device have substantially the same shape and are substantially aligned with one another in the vertical direction.

6. The semiconductor apparatus of claim 1, wherein the first portion of the channel portion of the first device and the first portion of the channel portion of the second device have substantially the same thickness.

7. The semiconductor apparatus of claim 1, wherein the first portion of the channel portion of the first device and the first portion of the channel portion of the second device have top surfaces that are substantially coplanar.

8. The semiconductor apparatus of claim 1, wherein channel portion comprises a single crystal semiconductor material.

9. The semiconductor apparatus of claim 1, wherein there is a crystal interface at least one of: between the first portion of the channel portion and the source/drain portions, between the second portion of the channel portion and the source/drain portions, the first portion of the channel portion and the second portion of the channel portion.

10. The semiconductor apparatus of claim 1, further comprising a spacer on a sidewall of the gate stack, wherein sidewalls of the spacer facing toward the source/drain portions are substantially coplanar in the vertical direction.

11. The semiconductor apparatus of claim 10, wherein the spacer comprises:
    a first portion extending on both sides of the channel portion and over an uppermost second portion of the channel portion; and
    a second portion extending between the second portions of the channel portion and between a lowermost second portion of the channel portion and the substrate,
    wherein the first portion and the second portion of the spacer comprise different materials.

12. The semiconductor apparatus of claim 1, wherein the gate stack extends on upper and lower surfaces of each of the second portions, and sidewalls of portions of the gate stack extending on the upper surface of each of the second portions are substantially aligned in the vertical direction with sidewalls of portions of the gate stack extending on the lower surface of a corresponding one of the second portions.

13. The semiconductor apparatus of claim 1, wherein the first portion and the second portion of the channel portion of each of the first device and the second device comprise different semiconductor materials.

14. The semiconductor apparatus of claim 1, wherein the first portion of the channel portion of the first device and the first portion of the channel portion of the second device comprise the same semiconductor material.

15. The semiconductor apparatus of claim 1, wherein the second portion of the channel portion of the first device and the second portion of the channel portion of the second device comprise the same semiconductor material.

16. The semiconductor apparatus of claim 1, wherein the first portion and the second portion of the channel portion of each of the first device and the second device have different doping concentrations and/or doping impurities.

17. The semiconductor apparatus of claim 1, further comprising an isolation layer formed on the substrate, wherein the gate stack is formed on the isolation layer.

18. The semiconductor apparatus of claim 17, further comprising a punch-through stopper under the first portion of the channel portion of at least one of the first device and the second device, the punch-through stopper being surrounded by the isolation layer at least at a lower portion thereof.

19. The semiconductor apparatus of claim 18, wherein the punch-through stopper is a semiconductor in contact with the substrate.

20. The semiconductor apparatus of claim 18, wherein,
    the at least one device is an n-type device and the semiconductor of the punch-through stopper is p-type doped; or
    the at least one device is a p-type device and the semiconductor of the punch-through stopper is n-type doped.

21. The semiconductor apparatus of claim 19, wherein the semiconductor of the punch-through stopper extends to a region of the source/drain portions.

22. The semiconductor apparatus of claim 19, wherein the semiconductor of the punch-through stopper has sidewalls that are substantially coplanar with sidewalls of the first portion of the channel portion facing away from the second portion, and has a thickness that is smaller than that of the first portion of the channel portion.

23. The semiconductor apparatus of claim 17, wherein a portion of the isolation layer below the first portion of the channel portion is interposed between the source/drain portions.

24. The semiconductor apparatus of claim 1, wherein the first device and the second device are devices of different conductivity types.

25. The semiconductor apparatus of claim 24, wherein the semiconductor apparatus has a complementary metal-oxide-semiconductor configuration.

26. The semiconductor apparatus of claim 24, wherein the substrate comprises well regions corresponding to the first device and the second device, respectively.

27. An electronic equipment comprising the semiconductor apparatus of claim 1.

28. The electronic equipment of claim 27, wherein the electronic equipment comprises a smart phone, a computer, a tablet computer, an artificial intelligence device, a wearable device, or a power bank.

29. A semiconductor apparatus comprising a first device and a second device that are opposite to each other on a substrate, wherein each of the first device and the second device comprises:
 a channel portion, comprising:
  a first portion extending in a vertical direction relative to the substrate; and
  a second portion extending from the first portion in a lateral direction relative to the substrate;
 source/drain portions in contact with the channel portion on both sides of the channel portion; and
 a gate stack overlapping the channel portion,
 wherein the second portion of the channel portion of the first device and the second portion of the channel portion of the second device extend toward or away from each other, and
 wherein the channel portion of at least one of the first device and the second device comprises a plurality of the second portions, that are spaced apart from one another in the vertical direction.

30. The semiconductor apparatus of claim 29, wherein the second portion of the channel portion of the first device and the second portion of the channel portion of the second device are provided in pairs, each pair of second portions being opposite to and substantially coplanar with each other.

31. The semiconductor apparatus of claim 29, wherein the plurality of second portions of the channel portion of at least one device have substantially the same shape and are substantially aligned with one another in the vertical direction.

32. The semiconductor apparatus of claim 29, further comprising a spacer on a sidewall of the gate stack, wherein sidewalls of the spacer facing toward the source/drain portions are substantially coplanar in the vertical direction.

33. The semiconductor apparatus of claim 32, wherein the spacer comprises:
 a first portion extending on both sides of the channel portion and over an uppermost second portion of the channel portion; and
 a second portion extending between the second portions of the channel portion and between a lowermost second portion of the channel portion and the substrate,
 wherein the first portion and the second portion of the spacer comprise different materials.

34. The semiconductor apparatus of claim 29, wherein the gate stack extends on upper and lower surfaces of each of the second portions, and sidewalls of portions of the gate stack extending on the upper surface of each of the second portions are substantially aligned in the vertical direction with sidewalls of portions of the gate stack extending on the lower surface of a corresponding one of the second portions.

35. The semiconductor apparatus of claim 29, further comprising an isolation layer formed on the substrate, wherein the gate stack is formed on the isolation layer.

36. The semiconductor apparatus of claim 35, further comprising a punch-through stopper under the first portion of the channel portion of at least one of the first device and the second device, the punch-through stopper being surrounded by the isolation layer at least at a lower portion thereof.

37. The semiconductor apparatus of claim 36, wherein the punch-through stopper is a semiconductor in contact with the substrate.

38. The semiconductor apparatus of claim 36, wherein,
 the at least one device is an n-type device and the semiconductor of the punch-through stopper is p-type doped; or
 the at least one device is a p-type device and the semiconductor of the punch-through stopper is n-type doped.

39. The semiconductor apparatus of claim 37, wherein the semiconductor of the punch-through stopper extends to a region of the source/drain portions.

40. The semiconductor apparatus of claim 37, wherein the semiconductor of the punch-through stopper has sidewalls that are substantially coplanar with sidewalls of the first portion of the channel portion facing away from the second portion, and has a thickness that is smaller than that of the first portion of the channel portion.

41. An electronic equipment comprising the semiconductor apparatus of claim 29.

42. The electronic equipment of claim 41, wherein the electronic equipment comprises a smart phone, a computer, a tablet computer, an artificial intelligence device, a wearable device, or a power bank.

* * * * *